United States Patent
Van Ostrand et al.

(10) Patent No.: US 12,223,149 B2
(45) Date of Patent: *Feb. 11, 2025

(54) PEN FOR USE WITH A TOUCH SCREEN

(71) Applicant: SIGMASENSE, LLC., Wilmington, DE (US)

(72) Inventors: Daniel Keith Van Ostrand, Leander, TX (US); Michael Shawn Gray, Elgin, TX (US)

(73) Assignee: SIGMASENSE, LLC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/213,585

(22) Filed: Jun. 23, 2023

(65) Prior Publication Data

US 2023/0359312 A1 Nov. 9, 2023

Related U.S. Application Data

(63) Continuation of application No. 17/646,041, filed on Dec. 27, 2021, now Pat. No. 11,726,626, which is a
(Continued)

(51) Int. Cl.
*G06F 3/044* (2006.01)
*G06F 3/0354* (2013.01)
(Continued)

(52) U.S. Cl.
CPC ........ *G06F 3/0446* (2019.05); *G06F 3/03547* (2013.01); *G06F 3/04883* (2013.01); *H03K 17/962* (2013.01)

(58) Field of Classification Search
None
See application file for complete search history.

(56) References Cited

U.S. PATENT DOCUMENTS 5,437,178 A 8/1995 Esin et al.
6,218,972 B1 4/2001 Groshong
(Continued)

FOREIGN PATENT DOCUMENTS

CN 103995626 A 8/2014
CN 104182105 A 12/2014
(Continued)

OTHER PUBLICATIONS

Baker; How delta-sigma ADCs work, Part 1; Analog Applications Journal; Oct. 1, 2011; 6 pgs.
(Continued)

*Primary Examiner* — Andre L Matthews
(74) *Attorney, Agent, or Firm* — Garlick & Markison; Timothy D. Taylor

(57) ABSTRACT

A pen for interacting with a touch screen of a computing device includes an alternating current coupling circuit and a sense-regulation circuit. The alternating current coupling circuit receives a sense signal from the touch screen. The alternating current coupling circuit transmits a transmit signal to the touch screen. The sense-regulation circuit receives the sense signal from the alternating current coupling circuit. The sense-regulation circuit receives a representation of transmit data. The sense-regulation circuit generates a comparison signal based on the sense signal and the representation of the transmit data. The sense-regulation circuit converts the representation of the transmit data into the transmit signal.

8 Claims, 19 Drawing Sheets

Related U.S. Application Data continuation of application No. 16/436,746, filed on Jun. 10, 2019, now Pat. No. 11,216,133.

(51) Int. Cl.
  *G06F 3/04883* (2022.01)
  *H03K 17/96* (2006.01)

(56) References Cited

U.S. PATENT DOCUMENTS

| | | |
|---|---|---|
| 6,665,013 B1 | 12/2003 | Fossum et al. |
| 7,476,233 B1 | 1/2009 | Wiener et al. |
| 7,528,755 B2 | 5/2009 | Hammerschmidt |
| 8,031,094 B2 | 10/2011 | Hotelling |
| 8,089,289 B1 | 1/2012 | Kremin et al. |
| 8,279,180 B2 | 10/2012 | Hotelling et al. |
| 8,537,110 B2 | 9/2013 | Kruglick |
| 8,547,114 B2 | 10/2013 | Kremin |
| 8,587,535 B2 | 11/2013 | Oda et al. |
| 8,625,726 B2 | 1/2014 | Kuan |
| 8,657,681 B2 | 2/2014 | Kim |
| 8,966,400 B2 | 2/2015 | Yeap |
| 8,982,097 B1 | 3/2015 | Kuzo et al. |
| 9,081,437 B2 | 7/2015 | Oda |
| 9,201,547 B2 | 12/2015 | Elias |
| 10,007,335 B2 | 6/2018 | Lee |
| 2003/0052657 A1 | 3/2003 | Koernle et al. |
| 2005/0235758 A1 | 10/2005 | Kowal et al. |
| 2011/0063154 A1 | 3/2011 | Hotelling et al. |
| 2011/0298745 A1 | 12/2011 | Souchkov |
| 2012/0278031 A1 | 11/2012 | Oda |
| 2013/0278447 A1 | 10/2013 | Kremin |
| 2014/0327644 A1 | 11/2014 | Mohindra |
| 2015/0091847 A1 | 4/2015 | Chang |
| 2015/0091859 A1* | 4/2015 | Rosenberg ............ G06F 3/0446 345/174 |
| 2015/0193025 A1* | 7/2015 | Rebeschi ............ G06F 3/03545 345/174 |
| 2015/0346889 A1 | 12/2015 | Chen |
| 2016/0188049 A1 | 6/2016 | Yang et al. |
| 2017/0031465 A1* | 2/2017 | Jung .................... G06F 3/03545 |
| 2018/0157354 A1 | 6/2018 | Blondin et al. |
| 2018/0275824 A1 | 9/2018 | Li |

FOREIGN PATENT DOCUMENTS

| | | |
|---|---|---|
| CN | 104536627 A | 4/2015 |
| CN | 107771273 A | 3/2018 |
| EP | 2284637 A1 | 2/2011 |

OTHER PUBLICATIONS

Brian Pisani, Digital Filter Types in Delta-Sigma ADCs, Application Report SBAA230, May 2017, pp. 1-8, Texas Instruments Incorporated, Dallas, Texas.

European Patent Office; Extended European Search Report; Application No. 19853507.2; Jun. 13, 2023; 7 pgs.

* cited by examiner computing device 10

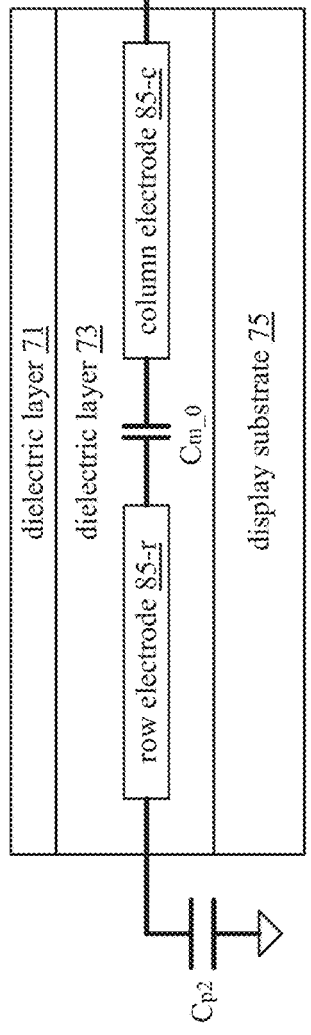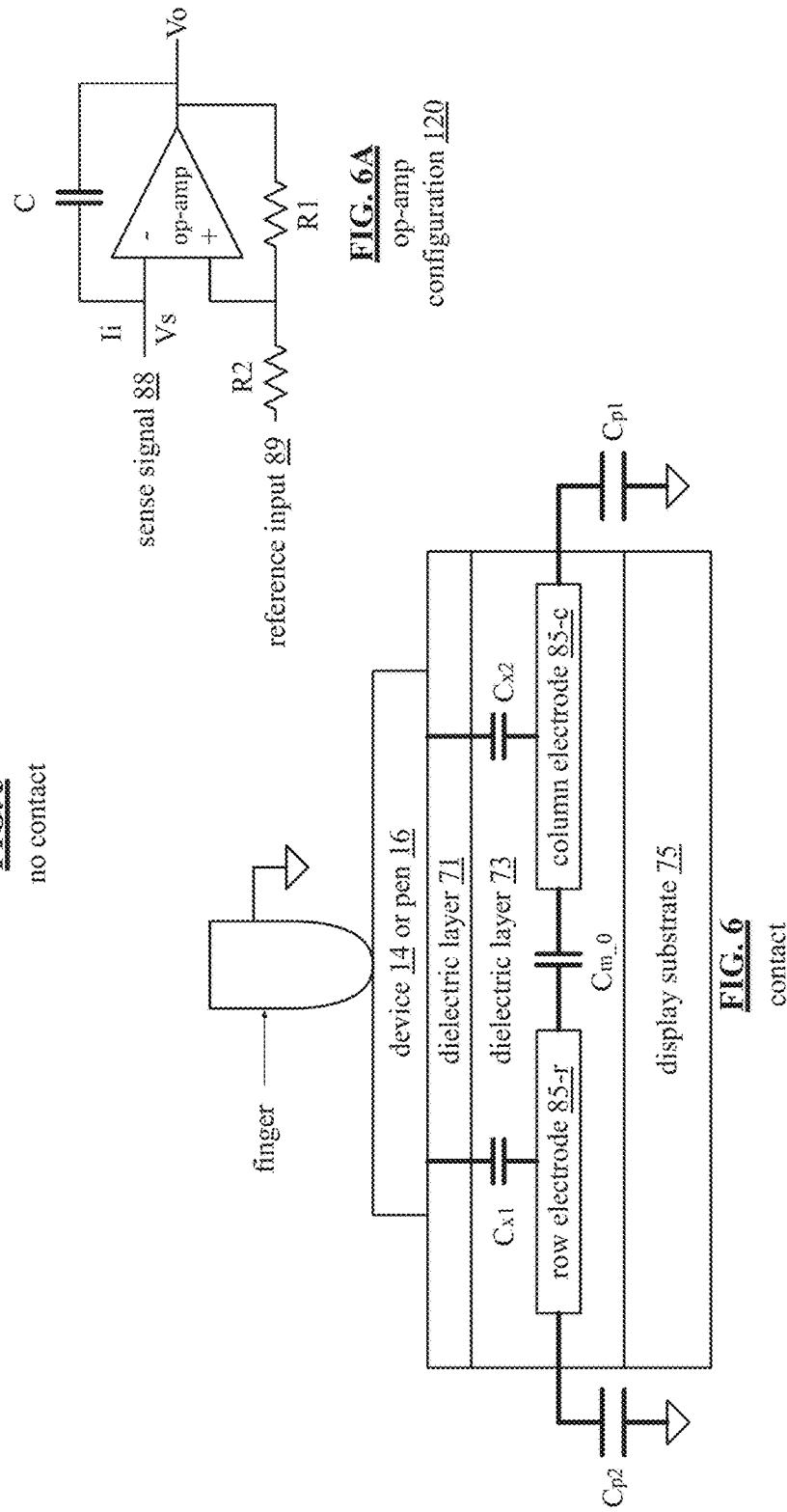

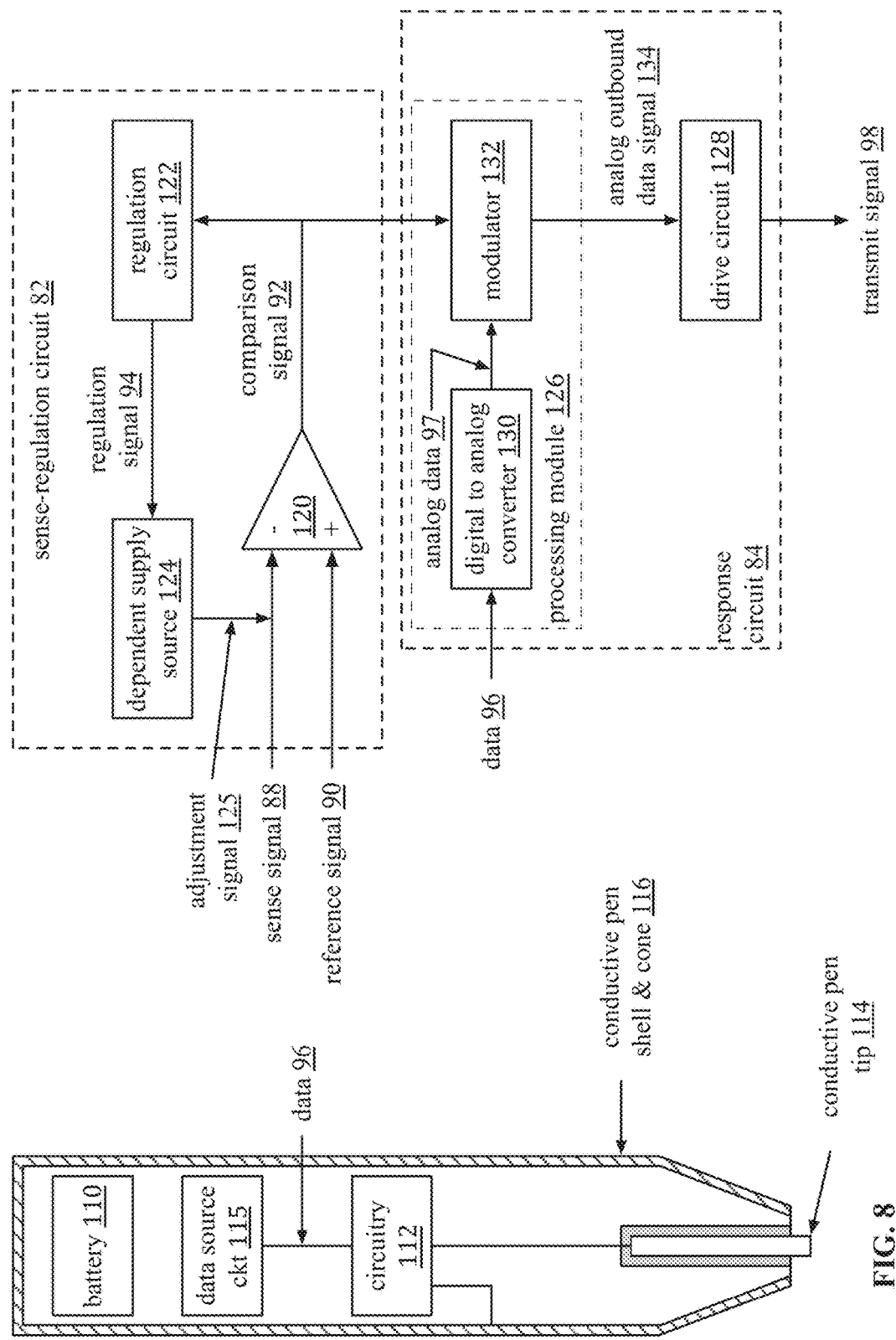

no data, ring back operation with data circuitry 112

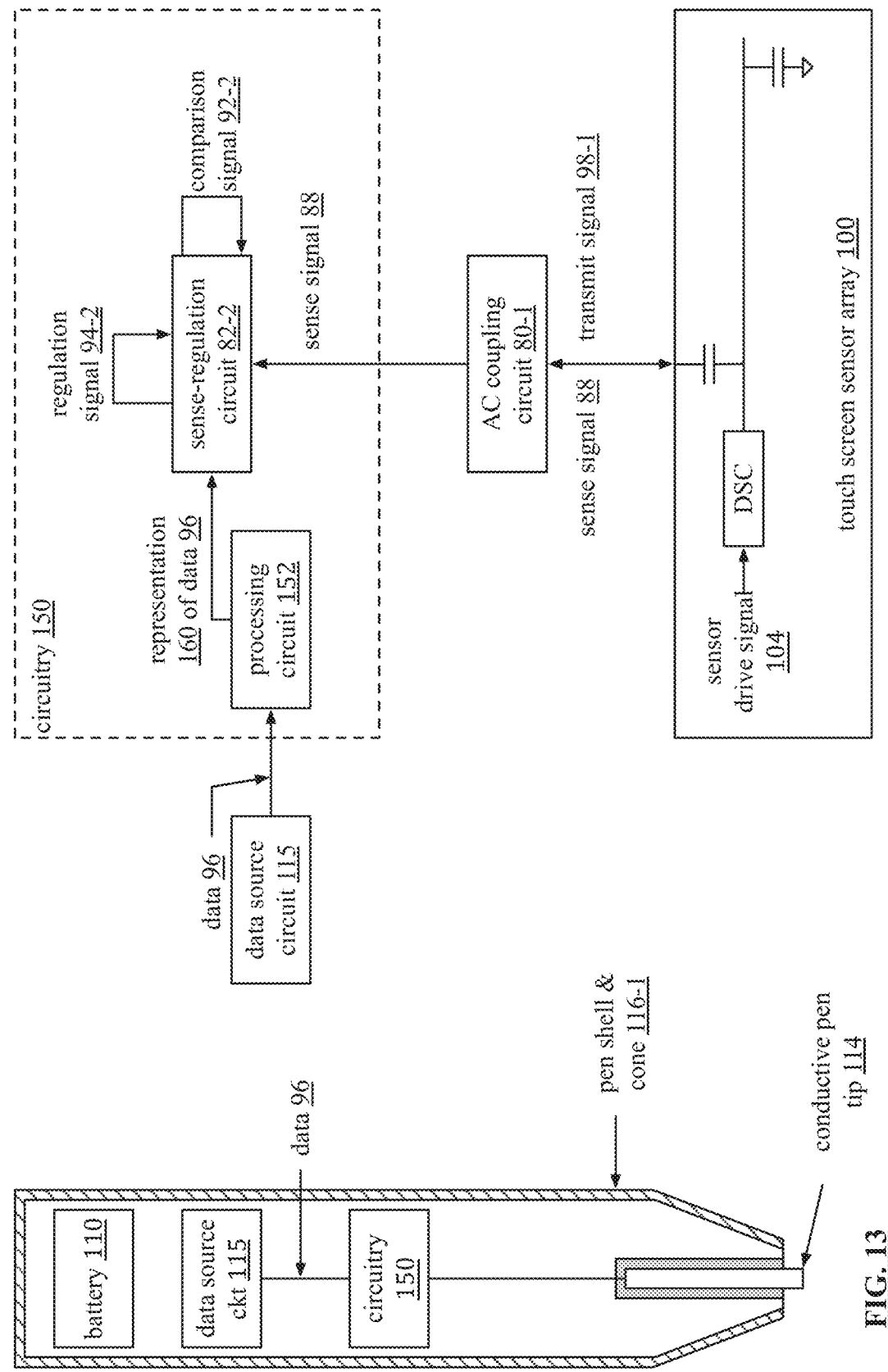

sense signal 88-1

PEN FOR USE WITH A TOUCH SCREEN

CROSS-REFERENCE TO RELATED APPLICATIONS

The present U.S. Utility Patent application claims priority pursuant to 35 U.S.C. § 120 as a continuation of U.S. Utility application Ser. No. 17/646,041, entitled "DEVICE FOR USE WITH A TOUCH SCREEN", filed Dec. 27, 2021, which is a continuation of U.S. Utility application Ser. No. 16/436,746 entitled "DEVICE FOR USE WITH A TOUCH SCREEN", filed Jun. 10, 2019, issued as U.S. Pat. No. 11,216,133 on Jan. 4, 2022, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates computer systems and more particularly to interaction with a touch screen of a computing device.

Description of Related Art

Computers include user interfaces to receive data from a user and to output data to a user. A common user interface is a graphical user interface (GUI) that provides images, or icons, for various types of data input (e.g., select a file, edit a word, type a character, draw a picture, look at a photo, format a document, etc.). In an example, the user selects an icon by manipulating a mouse to align a cursor with an icon and then "selects" the icon. In another example, the user selects an icon by touching the screen with the user's finger or with a special pen.

For general use of a pen with computers from different manufacturers and/or having different touch screen technologies, a pen includes a ring-back topology as described in patent application PCT/US2012/67897. The ring-back topology includes an inverting charge integrator and an inverting amplifier. When the tip of a ring-back pen touches the screen, the tip receives a signal from the screen. The inverting charge integrator integrates and inverts the received signal. The inverting amplifier inverts the integrated and inverted signal to produce an output signal that resembles the received signal. The pen sends the output signal back to the screen. The output signal affects the signal transmitted by the screen, which screen interprets as a touch.

BRIEF DESCRIPTION OF THE SEVERAL VIEWS OF THE DRAWING(S)

FIG. 5 is a schematic block diagram of an example of capacitance of a touch screen with no touch in accordance with the present invention;

FIG. 6 is a schematic block diagram of an example of capacitance of a touch screen with a touch from a pen or a device in accordance with the present invention;

FIG. 6A is a schematic block diagram of an embodiment of an operational amplifier configuration in accordance with the present invention;

FIG. 8 is a schematic block diagram of another embodiment of a pen in accordance with the present invention;

FIG. 9 is a schematic block diagram of an embodiment of a sense-regulation circuit and a response circuit of a pen in accordance with the present invention;

FIG. 13 is a schematic block diagram of another embodiment of a pen in accordance with the present invention;

FIG. 14 is a schematic block diagram of another embodiment of a pen in accordance with the present invention;

DETAILED DESCRIPTION OF THE INVENTION

Figure 1:
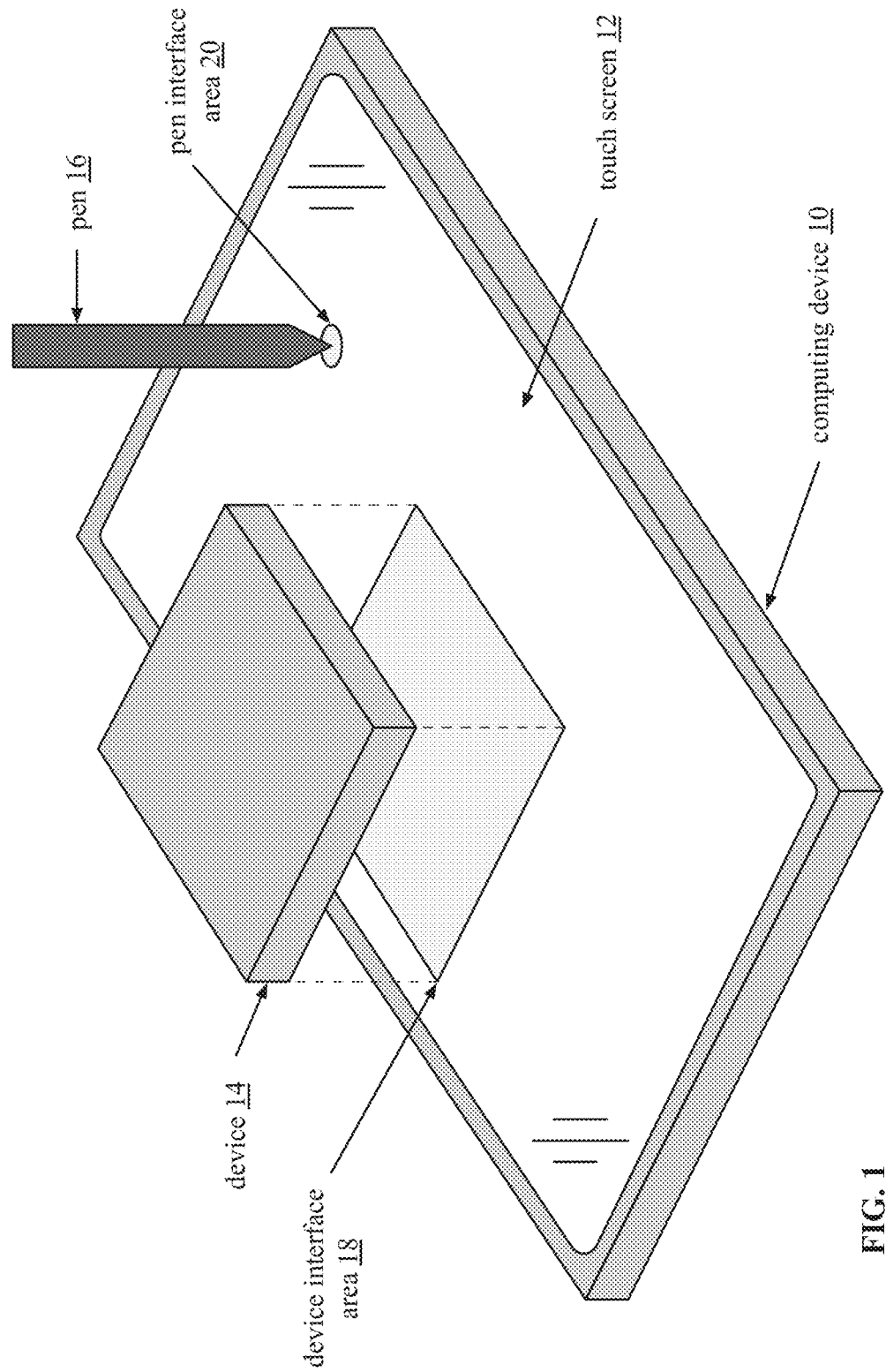
FIG. 1 is a schematic block diagram of an embodiment of a communication device with a pen and/or an input device in accordance with the present invention.

FIG. 1 is a schematic block diagram of an embodiment of a computing device 10 having a touch screen 12, which may further include a display to form a touch screen display. The computing device 10, which will be discussed in greater detail with reference to one or more of FIGS. 2-3, may be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core.

A fixed computing device may be a computer (PC), an interactive white board, an interactive table top, an interactive desktop, an interactive display, a computer server, a cable set-top box, vending machine, an Automated Teller Machine (ATM), an automobile, a satellite receiver, a television set, a printer, a fax machine, home entertainment equipment, a video game console, and/or any type of home or office computing equipment. An interactive display functions to provide users with an interactive experience (e.g., touch the screen to obtain information, be entertained, etc.). For example, a store provides interactive displays for customers to find certain products, to obtain coupons, to enter contests, etc.

A pen 16 and/or a device 14 interacts with the touch screen 12 to communication data with the computing device 10. For example, the pen 16 touches, or nearly touches, the touch screen at a pen interaction area 20. Within the pen interaction area 20, the touch screen 12 transmits a signal, or multiple signals, which are received by the pen 16. In a ring back mode, the pen 16 mimics the signal it receives and sends it back to the touch screen 12. In a more advanced mode, the pen 16 includes data with the ring back signal to provide additional information to the touch screen. For example, the data includes pen orientation data (e.g., angles of the pen in two or more axis), pressure data (e.g., how hard the user is pressing the pen on the screen), pen functionality (e.g., fine tip, coarse tip, clean line, fuzzy line, etc.), pen mode (e.g., draw, write, erase), pen features (e.g., color, button presses, etc.), pen data (e.g., battery life, user information, feature set, capabilities, etc.), etc.

In another advanced mode, the touch screen 12 provides additional data to the pen 16. For example, the signal, or signals, transmitted by the touch screen include embedded data. The embedded data for the pen 16 includes a variety of information. For example, the embedded data for the pen includes feedback for fine tuning the interaction between the pen and the touch screen (e.g., frequency selection, power control, etc.). In another example, the embedded data for the pen includes authentication data to ensure that user of the pen on the computing device is authorized to do so.

The device 14 interacts with the touch screen 12 in a similar manner as the pen 16, but may include more touch points to provided additional information. For example, the device 14 is a mouse, a ruler, a game piece, an educational piece for communicating data with an interactive desktop, an interactive tabletop, and/or an interactive white board. As another example, the device 14 is a cell phone case for facilitating communication between a cell phone and an interactive desktop, an interactive tabletop, and/or an interactive white board. As yet another example, the device 14 is circuitry included in cell phones to enable touch screen to touch screen communication.

Figure 2:
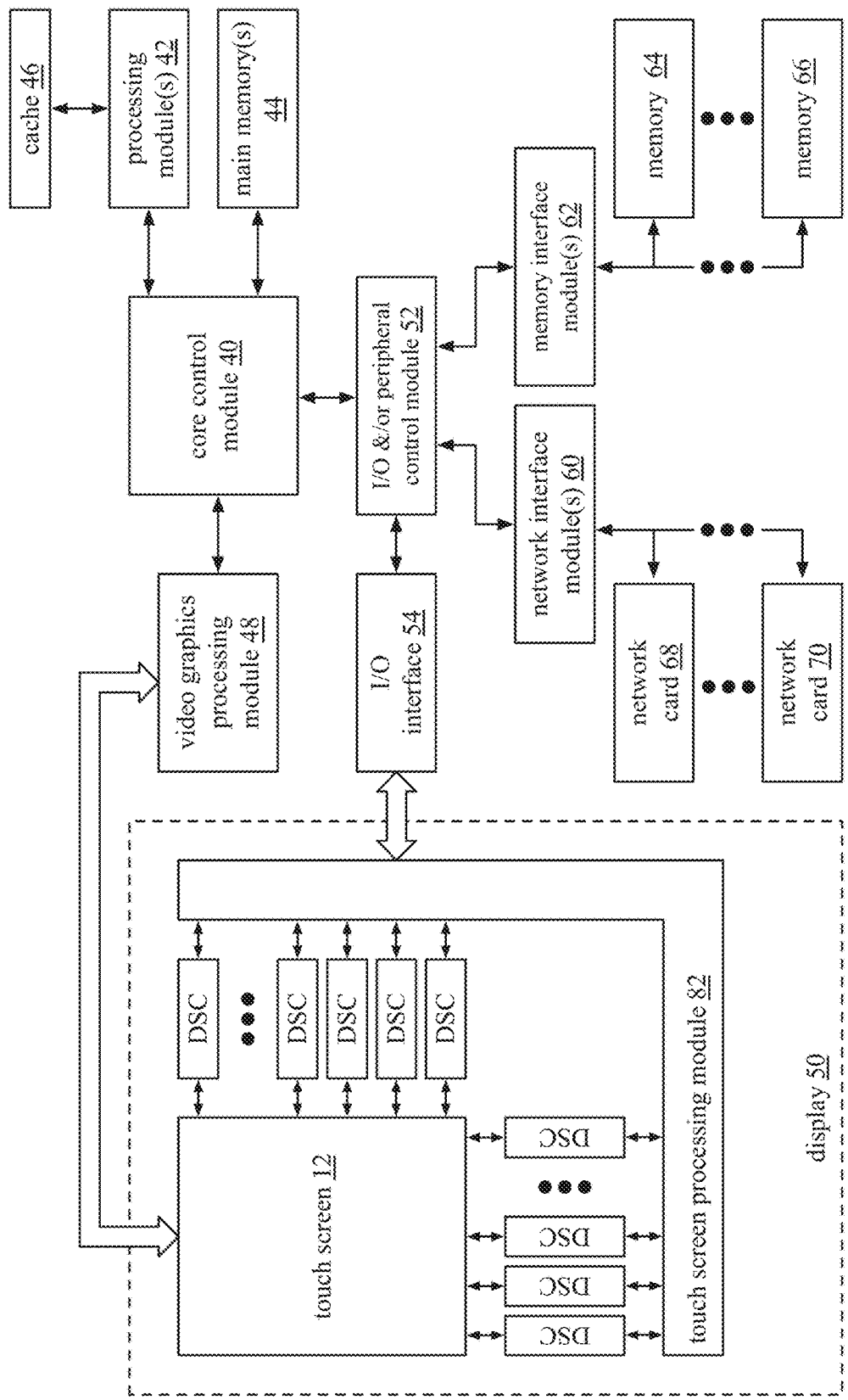
FIG. 2 is a schematic block diagram of an embodiment of a computing device in accordance with the present invention.

FIG. 2 is a schematic block diagram of an embodiment of a computing device 10 that includes a core control module 40, one or more processing modules 42, one or more main memories 44, cache memory 46, a video graphics processing module 48, a display 50, an Input-Output (I/O) peripheral control module 52, one or more input interface modules, one or more output interface modules, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 ($4^{th}$ generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and a network, or networks, via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) via the input interface module(s) and the I/O and/or peripheral control module 52. An input device includes a keypad, a keyboard, control switches, a touchpad, a microphone, a camera, etc. An input interface module includes a software driver and a hardware connector for coupling an input device to the I/O and/or peripheral control module 52. In an embodiment, an input interface module is in accordance with one or more Universal Serial Bus (USB) protocols.

The core control module 40 coordinates data communications between the processing module(s) 42 and output device(s) via the output interface module(s) and the I/O and/or peripheral control module 52. An output device includes a speaker, etc. An output interface module includes a software driver and a hardware connector for coupling an output device to the I/O and/or peripheral control module 52. In an embodiment, an output interface module is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

The display 50 includes the touch screen 12, a plurality of drive-sense circuits (DSC), and a touch screen processing module 82. The touch screen 12 includes a plurality of sensors (e.g., electrodes, capacitor sensing cells, capacitor sensors, inductive sensor, etc.) to detect a proximal touch of the screen. For example, when a pen touches the screen, capacitance of sensors proximal to the touch(es) are affected (e.g., impedance changes). As another example, when a pen touches the screen, a sensor's signal is changed (e.g., magnitude increase, magnitude decrease, phase shift, etc.). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 3:
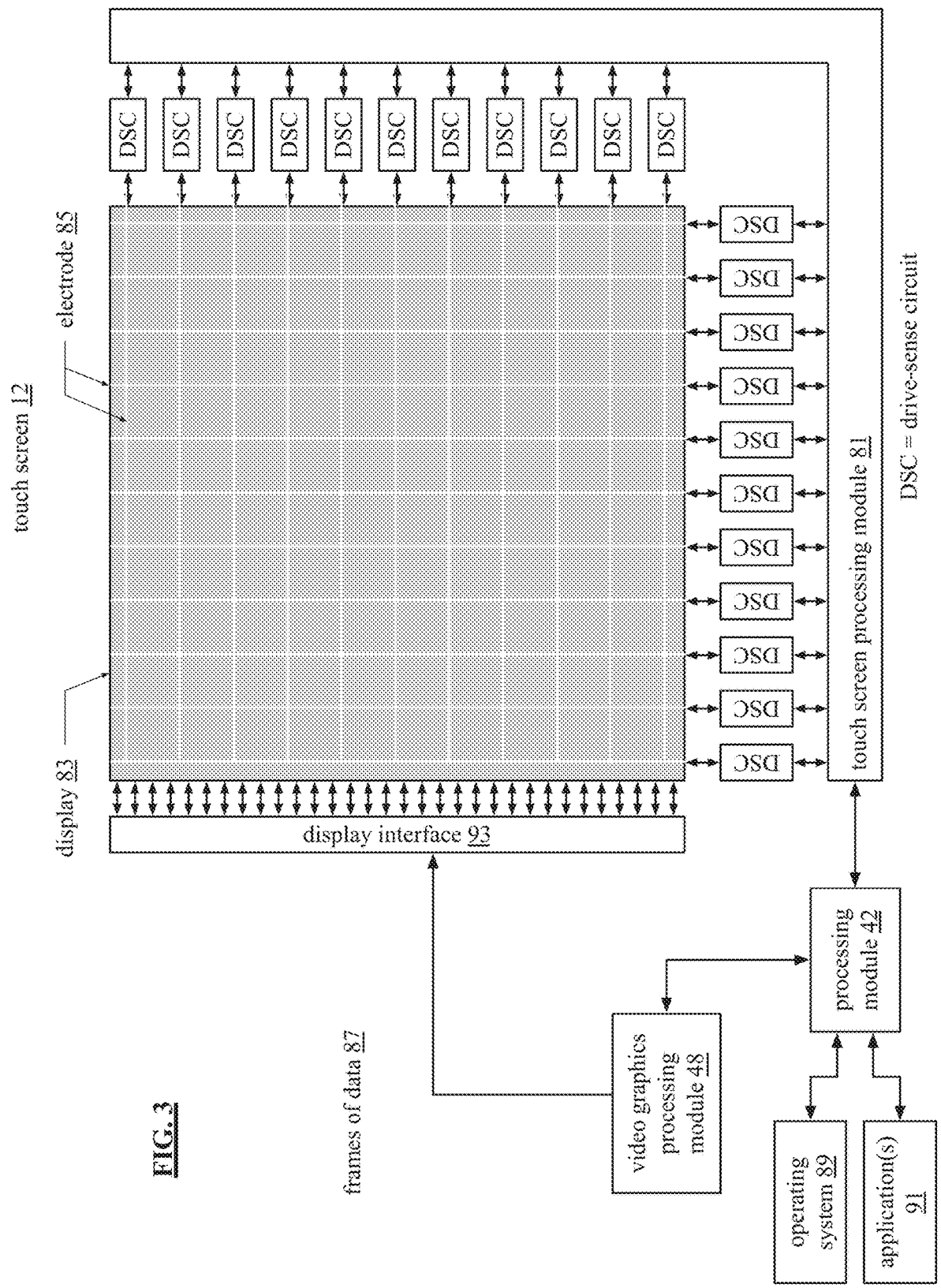
FIG. 3 is a schematic block diagram of another embodiment of a computing device in accordance with the present invention.

FIG. 3 is a schematic block diagram of another embodiment of a computing device that includes the touch screen 12, the drive-sense circuits (DSC), the touch screen processing module 81, a display 83, electrodes 85, the processing module 42, the video graphics processing module 48, and a display interface. The display 83 may be a large screen display (e.g., for portable computing devices) or a large screen display (e.g., for fixed computing devices). In general, a large screen display has a resolution equal to or greater than full high-definition (HD), an aspect ratio of a set of aspect ratios, and a screen size equal to or greater than thirty-two inches. The following table lists various combinations of resolution, aspect ratio, and screen size for the display 83, but it's not an exhaustive list.

| Resolution | Width (lines) | Height (lines) | pixel aspect ratio | screen aspect ratio | screen size (inches) |
|---|---|---|---|---|---|
| HD (high definition) | 1280 | 720 | 1:1 | 16:9 | 32, 40, 43, 50, 55, 60, 65, 70, 75, &/or >80 |
| Full HD | 1920 | 1080 | 1:1 | 16:9 | 32, 40, 43, 50, 55, 60, 65, 70, 75, &/or >80 |
| HD | 960 | 720 | 4:3 | 16:9 | 32, 40, 43, 50, 55, 60, 65, 70, 75, &/or >80 |
| HD | 1440 | 1080 | 4:3 | 16:9 | 32, 40, 43, 50, 55, 60, 65, 70, 75, &/or >80 |
| HD | 1280 | 1080 | 3:2 | 16:9 | 32, 40, 43, 50, 55, 60, 65, 70, 75, &/or >80 |
| QHD (quad HD) | 2560 | 1440 | 1:1 | 16:9 | 32, 40, 43, 50, 55, 60, 65, 70, 75, &/or >80 |
| UHD (Ultra HD) or 4K | 3840 | 2160 | 1:1 | 16:9 | 32, 40, 43, 50, 55, 60, 65, 70, 75, &/or >80 |
| 8K | 7680 | 4320 | 1:1 | 16:9 | 32, 40, 43, 50, 55, 60, 65, 70, 75, &/or >80 |
| HD and above | 1280->=7680 | 720->=4320 | 1:1, 2:3, etc. | 2:3 | 50, 55, 60, 65, 70, 75, &/or >80 |

The display 83 is one of a variety of types of displays that is operable to render frames of data into visible images. For example, the display is one or more of: a light emitting diode (LED) display, an electroluminescent display (ELD), a plasma display panel (PDP), a liquid crystal display (LCD), an LCD high performance addressing (HPA) display, an LCD thin film transistor (TFT) display, an organic light emitting diode (OLED) display, a digital light processing (DLP) display, a surface conductive electron emitter (SED) display, a field emission display (FED), a laser TV display, a carbon nanotubes display, a quantum dot display, an interferometric modulator display (IMOD), and a digital microshutter display (DMS). The display is active in a full display mode or a multiplexed display mode (i.e., only part of the display is active at a time).

The touch screen 12 includes integrated electrodes 85 that provide the sensors for the touch sense part of the touch screen display. The electrodes 85 are distributed throughout the display area or where touch screen functionality is desired. For example, a first group of the electrodes are arranged in rows and a second group of electrodes are arranged in columns.

The electrodes 85 are comprised of a transparent conductive material and are in-cell or on-cell with respect to layers of the display. For example, a conductive trace is placed in-cell or on-cell of a layer of the touch screen display. The transparent conductive material, which is substantially transparent and has negligible effect on video quality of the display with respect to the human eye. For instance, an electrode is constructed from one or more of: Indium Tin Oxide, Graphene, Carbon Nanotubes, Thin Metal Films, Silver Nanowires Hybrid Materials, Aluminum-doped Zinc Oxide (AZO), Amorphous Indium-Zinc Oxide, Gallium-doped Zinc Oxide (GZO), and poly polystyrene sulfonate (PEDOT).

In an example of operation, the processing module 42 is executing an operating system application 89 and one or more user applications 91. The user applications 91 includes, but is not limited to, a video playback application, a spreadsheet application, a word processing application, a computer aided drawing application, a photo display application, an image processing application, a database application, etc. While executing an application 91, the processing module generates data for display (e.g., video data, image data, text data, etc.). The processing module 42 sends the data to the video graphics processing module 48, which converts the data into frames of video 87.

The video graphics processing module 48 sends the frames of video 87 (e.g., frames of a video file, refresh rate for a word processing document, a series of images, etc.) to the display interface 93. The display interface 93 provides the frames of video to the display 83, which renders the frames of video into visible images.

While the display 83 is rendering the frames of video into visible images, the drive-sense circuits (DSC) provide sensor signals to the electrodes 85. When the screen is touched by a pen or device, signals on the electrodes 85 proximal to the touch (i.e., directly or close by) are changed. The DSCs detect the change for effected electrodes and provide the detected change to the touch screen processing module 81.

The touch screen processing module 81 processes the change of the effected electrodes to determine one or more specific locations of touch and provides this information to the processing module 42. Processing module 42 processes the one or more specific locations of touch to determine if an operation of the application is to be altered. For example, the touch is indicative of a pause command, a fast forward command, a reverse command, an increase volume command, a decrease volume command, a stop command, a select command, a delete command, etc.

If the signals received from the pen or device include embedded data, the touch screen processing module 81 interprets the embedded data and provides the resulting information to the processing module 42. If, computing device 10 is not equipped to process embedded data, the pen or device still communicated with the computing device using the change to the signals on the effected electrodes (e.g., increase magnitude, decrease magnitude, phase shift, etc.).

Figure 4:
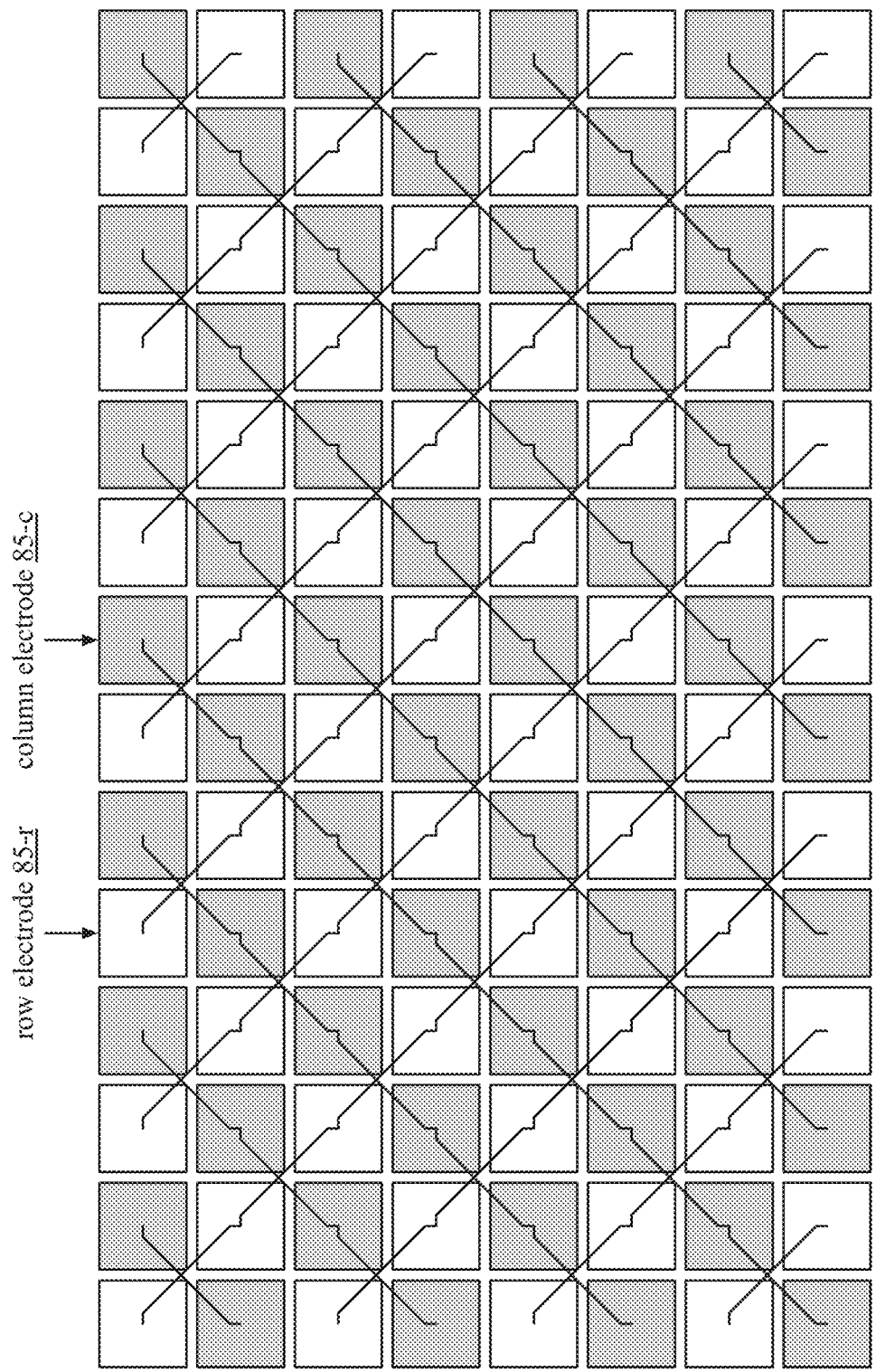
FIG. 4 is a schematic block diagram of an embodiment of a touch screen electrode pattern in accordance with the present invention.

FIG. 4 is a schematic block diagram of an embodiment of a touch screen electrode pattern that includes rows of electrodes 85-$r$ and columns of electrodes 85-$c$. Each row of electrodes 85-$r$ and each column of electrodes 85-$c$ includes a plurality of individual conductive cells (e.g., white squares for rows, gray squares for columns) that are electrically coupled together. The size of a cell depends on the desired resolution of touch sensing. For example, a cell size is 5 millimeters by 5 millimeters, which provides adequate touch sensing for cell phones and tablets. Making the cells smaller improves touch resolution and will typically reduce touch sensor errors (e.g., touching a "w" by an "e" is displayed). While the cells are shown to be square, they may be of any polygonal shape or circular shape.

The cells for the rows and columns may be on the same layer, as shown, or on different layers. The electrically coupling between the cells is done using vias and running traces on another layer. Note that the cells are on one or more ITO layers of a touch screen, which includes a touch screen display.

FIG. 5 is a cross section schematic block diagram of an example of capacitance of a touch screen 12 with no touch of a pen or a device. The electrode 85$s$ are positioned proximal to dielectric layer 73, which is between cover dielectric layer 71 and the display substrate 75. Each electrode 85 has a self-capacitance, which corresponds to a parasitic capacitance created by the electrode with respect to other conductors in the display (e.g., ground, conductive layer(s), and/or one or more other electrodes). For example, row electrode 85-$r$ has a parasitic capacitance $C_{p2}$ and column electrode 85-$c$ has a parasitic capacitance $C_{p1}$. Note that each electrode includes a resistance component and, as such, produces a distributed R-C circuit. The longer the electrode, the greater the impedance of the distributed R-C circuit. For simplicity of illustration the distributed R-C circuit of an electrode will be represented as a single parasitic capacitance.

As shown, the touch screen 12 includes a plurality of layers 71-75. Each illustrated layer may itself include one or more layers. For example, dielectric layer 71 includes a surface protective film, a glass protective film, and/or one or more pressure sensitive adhesive (PSA) layers. As another example, the second dielectric layer 73 includes a glass cover, a polyester (PET) film, a support plate (glass or plastic) to support, or embed, one or more of the electrodes 85-$c$ and 85-$r$, a base plate (glass, plastic, or PET), an ITO layer, and one or more PSA layers. As yet another example, the display substrate 75 includes one or more LCD layers, a back-light layer, one or more reflector layers, one or more polarizing layers, and/or one or more PSA layers.

A mutual capacitance (Cm_0) exists between a row electrode and a column electrode. When no touch is present, the self-capacitances and mutual capacitances of the touch screen 12 are at a nominal state. Depending on the length, width, and thickness of the electrodes, separation from the electrodes and other conductive surfaces, and dielectric properties of the layers, the self-capacitances and mutual capacitances can range from a few pico-Farads to 10's of nano-Farads.

FIG. 6 is a schematic block diagram of an example of capacitance of a touch screen with a touch from a pen 16 or a device 14. The pen 16 or device 14 is capacitive coupled to the row and column electrodes proximal to the touch. When the pen 16 or device 14 is touch by a person and is touching the touch screen, the person provides a path to ground such that the pen or device affects both the mutual capacitance and the self-capacitance. When the pen or device is not touched by a person, there is no path to ground and thus the pen or device only effects the mutual capacitance.

In addition, the pen or device receives signals from the touch screen via the capacitance coupling to the screen. The signals transmitted by the pen or device to the touch screen are also through the capacitance coupling and affect the signals on the electrodes 85.

As an example, the device 14 or pen 16 is capacitively coupled to the touch screen of the computing device via capacitor Cx1 and/or capacitor Cx2. For example, the pen 16 is coupled to the touch screen via capacitor Cx1 or capacitor Cx2 and the device 14 is coupled to the touch screen via capacitors Cx1 and Cx2. For a pen 16 touch, the capacitance of Cx1 or Cx2 is about 50 femto-Farads. Depending on the area of the contact surface of the device, the capacitance of Cx1 and/or Cx2 will be in the range of 50 femto-Farads to 10 or more pico-Farads.

Due to the small capacitance of Cx1 and/or Cx2, the pen 16 generates an effective negative capacitance to enable the drive sense circuits (DSC) detect the presence of the pen. In an embodiment, the effective negative capacitance is about −50 femto-Farads. To create the effective negative capacitance, an operational amplifier configuration as shown in FIG. 6A may be used.

FIG. 6A is a schematic block diagram of an embodiment of an operational amplifier configuration 120 that includes an operational amplifier (op-amp), a capacitor (C), and a pair of resistors (R1 & R2). The operational amplifier configuration receives two inputs: a sense signal 88 and a reference input 89. The sense signal 88, as described in greater detail below, is received from one or more drive sense circuits (DSCs) of the touch screen display. The reference input 89 may be one of a variety of inputs. In an example, the reference input 89 is a common ground. In another example, the reference input 89 is a reference signal (e.g., voltage or current). In a further example, the reference input 89 is an analog representation of data to be transmitted to the touch screen display. In this embodiment, the negative capacitance is approximately equal to —C*R2/R1.

When the pen tip touches the screen, the operational amplifier configuration 120 creates Vo to be a scaled and inverted version of the Vs. By varying the magnitude of Vo, the capacitive coupling between the pen and the touch screen can be varied. For example, by having Vs at 1 volt and generating Vo to be 15 volts, capacitance Cx1 and/or Cx2 is increased by about 16 times.

Figure 7:
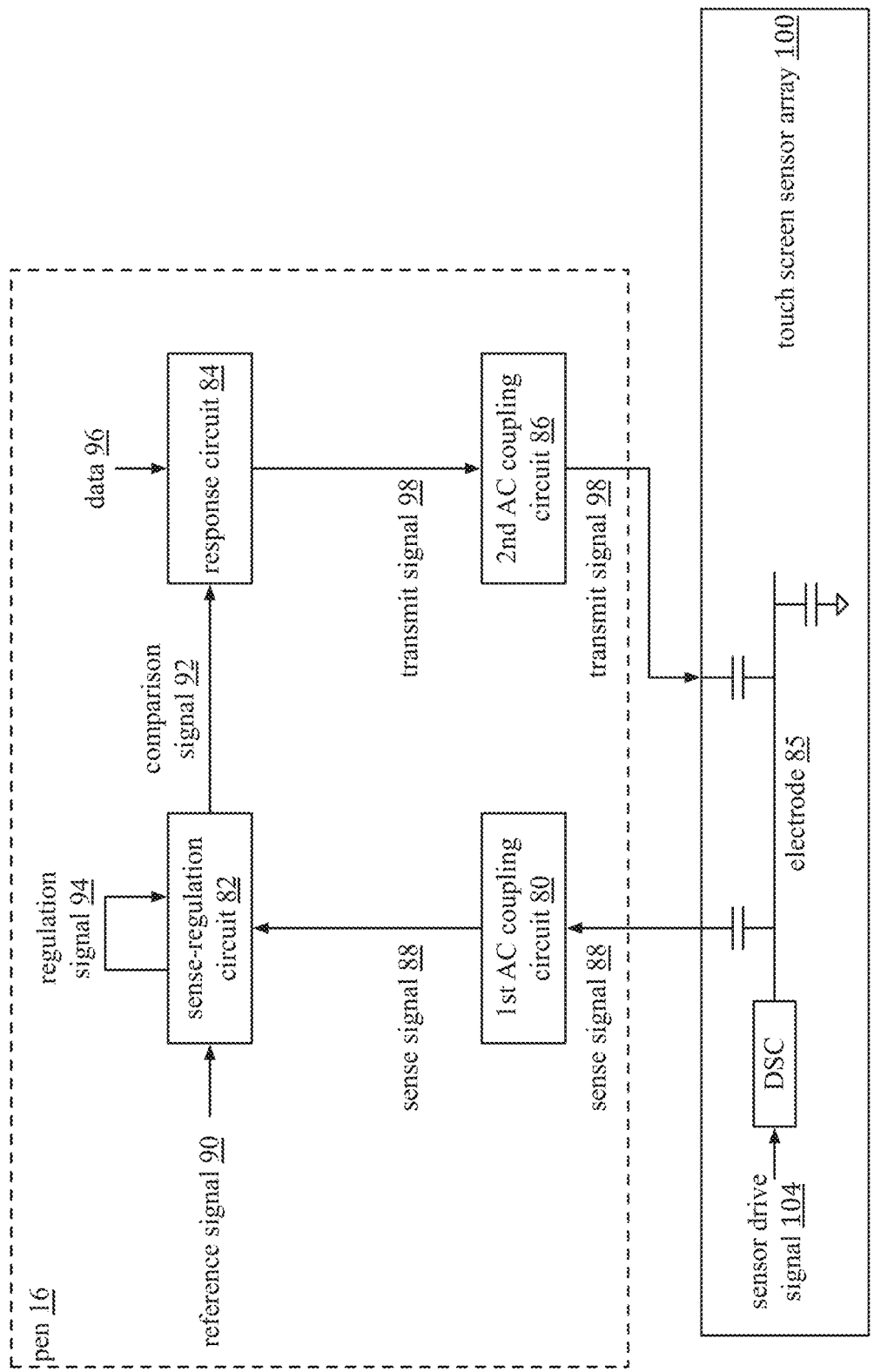
FIG. 7 is a schematic block diagram of an embodiment of a pen in accordance with the present invention.

FIG. 7 is a schematic block diagram of an embodiment of a pen 16 that includes a first AC coupling circuit 80, a sense-regulation circuit 82, a response circuit 84, and a second AC coupling circuit 86. The touch screen sensor array 100 includes row and column electrodes and drive sense circuits (DSC) driving and sensing each electrode.

The DSC drives a sensor drive signal 104 on to the electrode 85 to produce a sense signal 88. The sensor drive signal 104 may be an analog signal or a digital signal. In an embodiment, the sensor drive signal 104 is an analog signal and the DSC functions as described in co-pending patent application entitled, "DRIVE SENSE CIRCUIT WITH DRIVE-SENSE LINE," having a serial number of Ser. No. 16/113,379, and a filing date of Aug. 27, 2018. Note that, if the touch screen sensor array 100 does not include DSCs, then the touch screen functions in a ring-back mode (e.g., the pen's transmit signal 98 affects the sense signal 88, which can be detected by the touch screen sensor array as a touch of the pen with no extra data being communicated there between).

The first AC coupling circuit 80 is operable to receive a sense signal 88 from the touch screen sensor array 100. The first AC coupling circuit 80, which will be described in greater detail with reference to FIG. 8, provides the sense signal 88 to the sense-regulation circuit 82. The sense-regulation circuit 82 is operable to compare the sense signal 88 to a reference signal 90 (e.g., a voltage reference, a current reference) to produce a comparison signal 92. As such, the comparison signal 92 is a representation of the sense signal 88 (e.g., inverted signal, non-inverted signal, integrated signal, etc.).

The sense-regulation circuit 82 then generates a regulation signal 94 based on the comparison signal 92 to regulate the receiving of the sense signal 88. By regulating the receiving of the sense signal 88 (e.g., keeping it a desired voltage level, a desired current level, etc.), the resulting comparison signal 92 is reflective of changes within the sense-regulation circuit 82 to keep the sense signal 88 at the desired voltage and/or current level with respect to the reference signal 90. If data is embedded in the sense signal 88, the comparison signal 88 will include a representation of that data and a representation of the sense signal 88. If there is not embedded data, the comparison signal 88 only includes the representation of the sense signal 88.

The response circuit 84 is operable to generate a transmit signal 98 based on the comparison signal 92 and data 96. In an embodiment, the response circuit 84 includes a processing circuit or processing module to combine the comparison signal 92 and the data 96. For example, the response circuit 84 modulates the data 96 on to the comparison signal 92 to produce the transmit signal 98. As a specific example, the response circuit performs one or more of Amplitude Shift Keying (ASK), Phase Shift Keying (PSK), and Amplitude Modulation (AM) to produce the transmit signal 98 from the comparison signal 92 and the data 96. In an embodiment, the response circuit is a signal generator as described in co-pending patent application entitled, "RECEIVE ANALOG TO DIGITAL CIRCUIT OF A LOW VOLTAGE DRIVE CIRCUIT DATA COMMUNICATION SYSTEM", having a serial number of Ser. No. 16/266,953, and a filing date of Feb. 4, 2019.

The second AC coupling circuit 86 is operable to transmit the transmit signal 98 to the touch screen sensor array 100. For example, the second AC coupling circuit 86 sends the transmit signal to the electrode 85 via the capacitive coupling. The DSC circuit senses the transmit signal 98 on the electrode as a change in the sensor drive signal 104, where the change is an impedance change, a voltage change, a current change, a phase change, a frequency change, and/or a magnitude change. The DSC provides the detected change to the touch screen processing module 81 (of FIG. 3), which processes the signal to determine a touch of the pen and to further interpret the data contained in the transmit signal.

In an embodiment, there is no data 96. As such, the transmit signal 98 includes the comparison signal 92, which is a representation of the sense signal 88. As such, the pen 16 is provided a regulated ring-back signal to the touch screen. In another embodiment, the transmit signal 98 includes the comparison signal 92 and the data 96, but the touch screen sensor array 100 does not include DSCs. In this embodiment, the data 96 embedded in the transmit signal 98 is ignored by the touch screen sensor array 100 and the touch screen sensor array 100 processes the comparison signal 92 contained in the transmit signal 98.

FIG. 8 is a schematic block diagram of another embodiment of a pen 16 that includes a battery 110, one or more data source circuits 115, circuitry 112, a conductive pen tip 114, and a conductive pen shell & cone 116. The conductive pen tip 114 is composed of one or more conductive materials and is electrically isolated from the conductive shell & cone 116, which is also composed on one or more conductive materials (e.g., metal traces in a plastic substrate, metal, ITO, a conductive polymer, etc.). In addition, the conductive pen tip 114 is at least partially physically contained within the cone part of the conductive pen shell & cone 116. In another embodiment, the conductive pen tip 114 is electrically coupled via a coupling circuit to the conductive shell & cone 114. For example, the coupling circuit is one or more of a wire, a capacitor, and an inductor.

The circuitry 112, which will be described in greater detail with reference to FIG. 9, is coupled to the conductive pen tip 114 and to the conductive shell & cone 116. In one embodiment, the first AC coupling circuit 80 is the conductive pen tip 114 and the second AC coupling circuit 86 is the conductive pen shell and cone 116. In another embodiment, the first AC coupling circuit 80 is a conductive pen shell and cone 116 and the second AC coupling circuit 86 is the conductive pen tip 114.

The data source circuit 115 provides the data 96 to the circuitry 112, which includes the sense-regulation circuit 82 and the response circuit 84. In an embodiment, the data source circuit 115 is a pressure sensor coupled to a conductive pen tip 114. The pressure sensor measures pressure on the conductive pen tip when the conductive pen tip is in physical contact with the touch screen. The pressure sensor converts the measured pressure into the data 96.

In another embodiment, the data source circuit 115 is an orientation sensor (e.g., accelerometer, gyroscope, axial capacitance sensor array, etc.) that is measures three-dimensional orientation of on the pen 16 when the pen is in physical contact with the touch screen. The orientation sensor then converts the measured three-dimensional orientation into the data 96.

FIG. 9 is a schematic block diagram of an embodiment of the circuitry 112 of the pen 16 that includes the sense-regulation circuit 82 and the response circuit 84. The sense-regulation circuit 82 includes an operational amplifier configuration 120 (which may be implemented as shown in FIG. 6A or in a different manner), a regulation circuit 122, and a dependent current source 124. The response circuit 84 includes a processing module 126 and a drive circuit 128. The processing module 126 is configured to provide, or include, a digital to analog converter 130 and a modulator 132.

In an example of operation, the operational amplifier 120 receives the sense signal 88 at its negative input and a reference signal 90 at its positive input to generate the comparison signal 92. The regulation circuit 122 generates a regulation signal 94 from the comparison signal 92. The dependent supply source 124 (e.g., a dependent current source, a dependent voltage supply, a bidirectional dependent current source, a bidirectional dependent voltage supply, etc.) generates an adjustment signal 125 such that the voltages inputted in to the operational amplifier 120 remain substantially equal, which provides the regulating of receiving the sense signal.

As a specific example, the sense signal 88 is a sinusoidal signal having a frequency in the range of tens of Kilo-Hertz to tens of Giga-Hertz and the reference signal 90 is a DC signal (e.g., a DC voltage reference or a DC current reference). The output of the operational amplifier 120 (i.e., the comparison signal 92) will correspond to the inversion of the sense signal 88 (e.g., an inverted sinusoidal signal). The regulation circuit 122 (which may be a capacitor, resistor, wire, combination of capacitors and/or resistors, an integrator, etc.) and the dependent supply source 124 provide the gain for the feedback loop of the sense-regulation circuit 82 to generate the regulation signal 94 so that the comparison signal 92 does not get clipped (e.g., its magnitude is limited by the power supply voltage).

As another specific example, the sense signal 88 is a digital pulse train having a clock rate in the range of tens of Kilo-Hertz to tens of Giga-Hertz and the reference signal 90 is a DC signal. The output of the operational amplifier 120 (i.e., the comparison signal 92) will correspond to the inversion of the sense signal 88 (e.g., an inverted digital pulse train). The regulation circuit 122 and the dependent supply source 124 provide the gain for the feedback loop of the sense-regulation circuit 82 to generate the regulation signal 94 so that information in the digital pulse train is retained by the comparison signal 92.

Returning to the example of operation, the digital to analog converter 130 converts the data 96 into an analog data 97. The modulator 132 modulates the analog data 97 with the comparison signal 92 to produce an analog outbound data signal 134. The drive circuit 128 (e.g., a driver, a unity gain amplifier, a voltage to current converter, a current to voltage converter, etc.) creates the transmit signal 98 from the analog outbound data signal 134. As an example, the transmit signal 98 is a higher power version (e.g., more voltage and/or more current) of the analog output data signal 134.

The modulator 132 can modulate the analog data 97 with the comparison signal 92 in a variety of ways. For example, the modulator 132 uses Amplitude Shift Keying (ASK) to modulate the analog data 97 with the comparison signal 92, which is done at an "n" cycle by cycle basis of the comparison signal, wherein "n" is an integer equal to or greater than 1. As another example, the modulator 132 uses Phase Shift Keying (PSK) to modulate the analog data 97 with the comparison signal 92, which is done at the "n" cycle by cycle basis of the comparison signal. As yet another example, the modulator 132 uses a combination of ASK and PSK to modulate the analog data 97 with the comparison signal 92, which is done at the "n" cycle by cycle basis of the comparison signal. As a further example, the modulator 132 uses Amplitude Modulation (AM) to modulate the analog data 97 with the comparison signal 92, which is done at the clock rate of the data 96.

Figure 10:
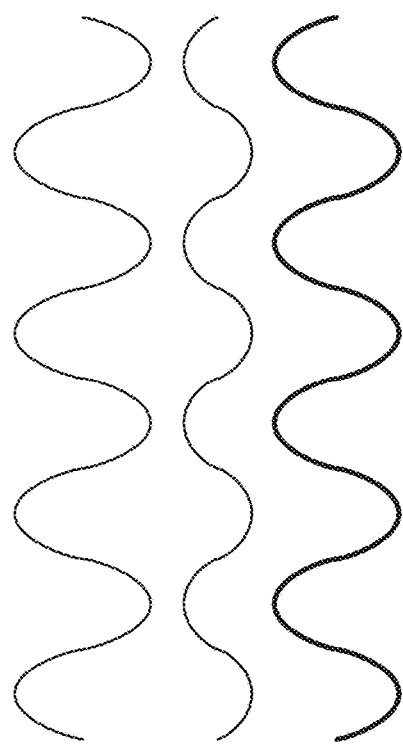
FIG. 10 is a schematic block diagram of an example of ring-back with no data in accordance with the present invention.

FIG. 10 is a schematic block diagram of an example of ring-back signaling with no data (e.g., the data is a null set for ring-back only touch sensing operation). As shown, the sense signal 88 is a sinusoidal signal having a frequency in the range of tens of Kilo-Hertz to tens of Giga-Hertz and the reference signal 90 (not shown) is a DC signal. The comparison signal 92 is the inversion of the sense signal (e.g., an inverted sinusoidal signal), which may have the same or different peak to peak value as the sense signal (shown to be less than). The transmit signal 98 is a higher power version of the comparison signal 92.

Figure 11:
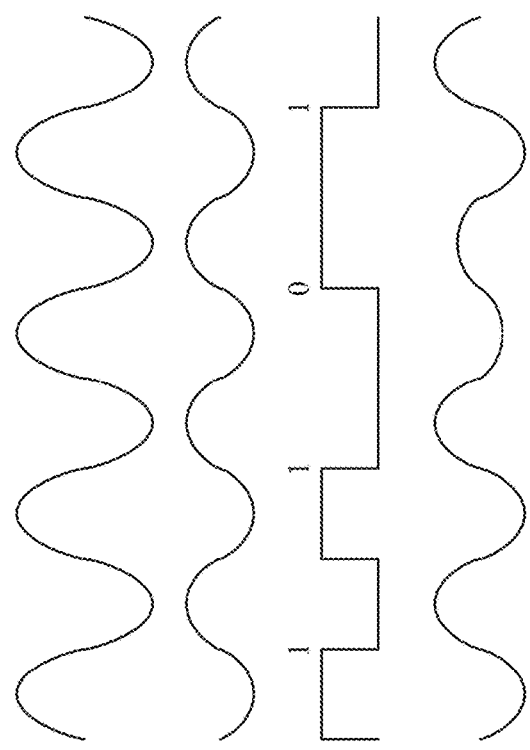
FIG. 11 is a schematic block diagram of an example of ring-back with data in accordance with the present invention.

FIG. 11 is a schematic block diagram of an example of ring-back with data 96 that is modulated with the comparison signal using ASK. As shown, the sense signal 88 is a sinusoidal signal and the comparison signal 92 is an inversion of the sense signal. The data 96 is shown as four bits, those being 1, 1, 0, 1. For this example of ASK, the 1's are represented as a first magnitude of the transmit signal and the 0's are represented as a second magnitude of the transmit signal 98, where the first magnitude is greater than the second magnitude.

Figure 12:
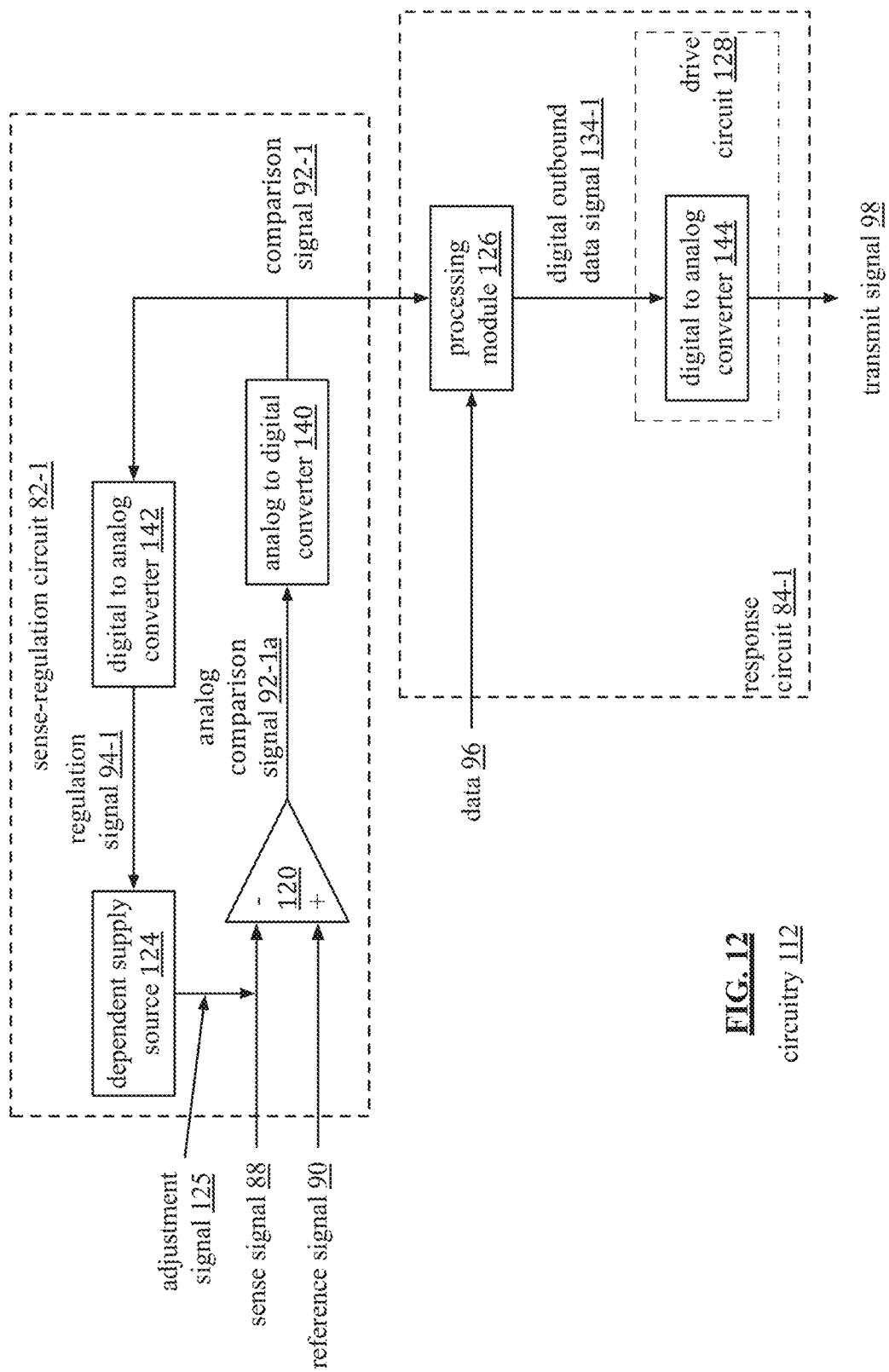
FIG. 12 is a schematic block diagram of another embodiment of a sense-regulation circuit and a response circuit of a pen in accordance with the present invention.

FIG. 12 is a schematic block diagram of another embodiment of the circuitry 112 of the pen 16 that includes a sense-regulation circuit 82-1 and a response circuit 84-1. The sense-regulation circuit 82-1 includes the operational amplifier configuration 120 (which may be implemented as shown in FIG. 6A or in a different manner), an analog to digital converter 140, a digital to analog converter 142, and the dependent supply source 124. As used herein, a suffix of a reference number indicates that the referenced component is similar to a like-referenced component with a different suffix, where an overall operation of the liked-reference number components is similar, but the liked-reference number components operate on different data, operate in different domains (e.g., analog or digital, time or frequency), and/or perform in a different manner to achieve a similarly desired result.

The operational amplifier 120 generates an analog comparison signal 92-1 based on the sense signal 88 and the reference signal 90. The analog to digital converter 140 converts the analog comparison signal 92-1*a* into the comparison signal 92-1. The digital to analog converter 142 converts the comparison signal 92-1 into the regulation signal 94-1. The dependent supply source 124 generates the adjustment signal 125 based on the regulation signal.

The processing module 126 of the response circuit 84-1 digitally modulates the data 96 with the digital comparison signal 92-1 to produce a digital outbound data signal 134-1. The drive circuit 128 includes a digital to analog converter 144, which converts the digital outbound data signal 134-1 into the transmit signal 98.

FIG. 13 is a schematic block diagram of another embodiment of a pen 16-1 that includes a battery 110, one or more data source circuits 115, circuitry 150, a conductive pen tip 114, and a pen shell & cone 116-1 (which may or may not be conductive). The circuitry 150, which will be described in greater detail with reference to FIG. 14, is coupled to the conductive pen tip 114 for transmitting and receiving data from the touch screen. The data source circuit 115 provides the data 96 to the circuitry 150, which includes a sense-regulation circuit 82-2.

FIG. 14 is a schematic block diagram of another embodiment of the circuitry 150 of the pen 16-1. The circuitry 150 includes a processing circuit 150 and the sense-regulation circuit 82-2.

In an example of operation, the AC coupling circuit 80-1 receives the sense signal 88 from the touch screen sensor array 100. In one embodiment, the AC coupling circuit 80-1 is the conductive pen tip 114. In another embodiment, the AC coupling circuit 80-1 is the conductive pen shell and cone 116.

The sense-regulation circuit 82-2 receives the sense signal 88 and receives a representation 160 of the data 96 from the processing circuit 152. The processing circuit 152 will be described in greater detail with reference to FIG. 17. The sense-regulation circuit 82-2 generates a comparison signal 92-2 based on the sense signal 88 and the representation 160 of the data 96. The sense-regulation circuit 82-2 then generates a regulation signal 94-2 to regulate receiving of the sense signal and transmitting of a transmit signal 98-1. The AC coupling circuit transmits the transmit signal 98-1 to the touch screen.

In another embodiment, the sense-regulation circuit 82-2 generates a separate ring back signal based on the sensed signal. A second AC coupling circuit 86 of the pen 16-1 transmits the ring-back signal to the touch screen.

Figure 15:
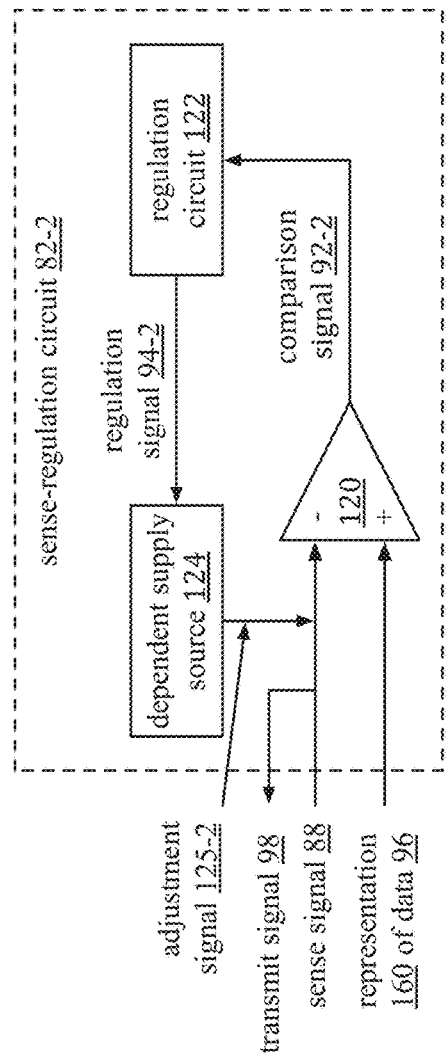
FIG. 15 is a schematic block diagram of another embodiment of a sense-regulation circuit of a pen in accordance with the present invention.

FIG. 15 is a schematic block diagram of another embodiment of the sense-regulation circuit 82-2 of the pen 16-1. The sense-regulation circuit 82 includes the operational amplifier configuration 120 (which may be implemented as shown in FIG. 6A or in a different manner), the regulation circuit 122, and the dependent current source 124.

In an example of operation, the operational amplifier 120 receives the sense signal 88 at its negative input and the representation 160 of the data 96 at its positive input to generate the comparison signal 92-2. The regulation circuit 122 generates a regulation signal 94-2 from the comparison signal 92-2. The dependent supply source 124 generates an adjustment signal 125-2 such that the voltages inputted into the operational amplifier 120 remain substantially equal, which provides the regulating of receiving the sense signal 88 and regulation of transmitting the transmit signal 98.

As a specific example, the sense signal 88 is a sinusoidal signal having a frequency in the range of tens of Kilo-Hertz to tens of Giga-Hertz and the representation 160 of the data 96 is a second sinusoidal signal having a different frequency than that of the sense signal. The output of the operational amplifier 120 (i.e., the comparison signal 92) correspond to a difference between the sense signal 88 and the representation 160 of the data 96. The regulation circuit 122 and the dependent supply source 124 provide the gain for the feedback loop of the sense-regulation circuit 82 to generate the regulation signal 94 so that the comparison signal 92 does not get clipped. As such, the comparison signal 92-2 includes a representation (e.g., includes the same information but may be of a different magnitude, phase, or domain) of the sense signal 88 and of the representation 160 of the data 96.

Figure 16:
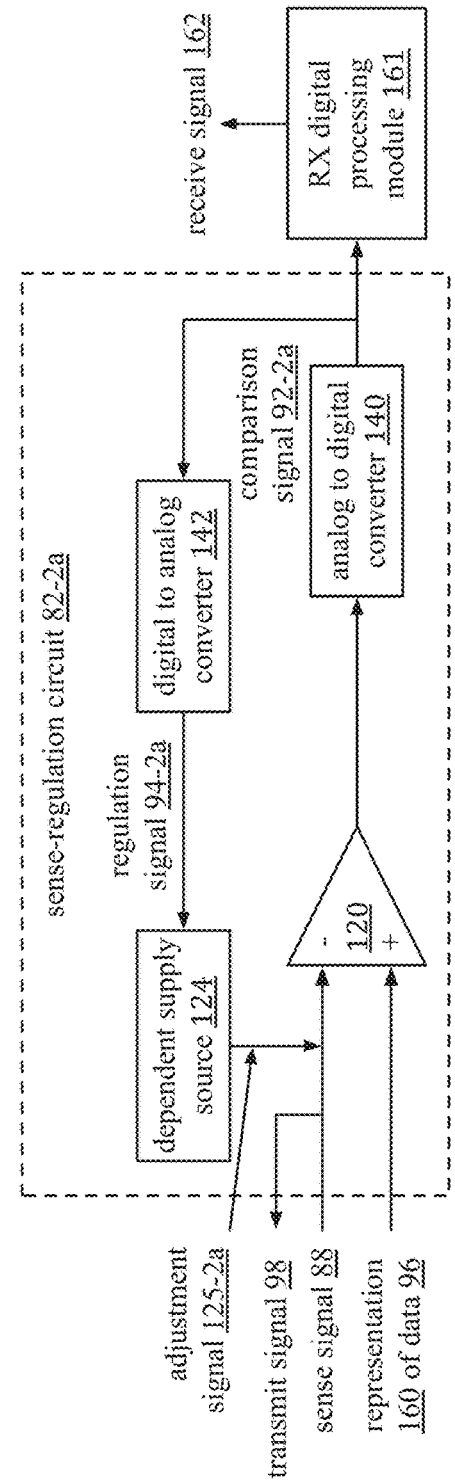
FIG. 16 is a schematic block diagram of another embodiment of a sense-regulation circuit of a pen in accordance with the present invention.

FIG. 16 is a schematic block diagram of another embodiment of the sense-regulation circuit 82-2*a* and a receive digital processing module 161 of the pen 16-1. The sense-regulation circuit 82-2*a* includes the operational amplifier configuration 120 (which may be implemented as shown in FIG. 6A or in a different manner), the analog to digital converter 140, the digital to analog converter 142 and the dependent current source 124.

In an example of operation, the operational amplifier 120 receives the sense signal 88 at its negative input and the representation 160 of the data 96 at its positive input to generate analog comparison signal 92-2. The analog to digital converter 140 converts the analog comparison signal 92-2 into a digital comparison signal 92-2*a*. The digital to analog converter 142 converts the digital comparison signal 92-2*a* into the regulation signal 94-2*a*. The dependent supply source 124 generates an adjustment signal 125-2*a* such that the voltages inputted into the operational amplifier 120 remain substantially equal, which provides the regulating of receiving the sense signal 88 and regulation of transmitting the transmit signal 98.

The receive digital processing module 161 receives the comparison signal 92-2*a* and extracts, therefrom, receive data. The receive data is regarding interoperation of the touch screen and the pen. For example, the receive data is feedback from touch screen regarding data received from pen. As another example, the receive data is for calibration of the pen for use with the touch screen. As another example, the receive data indicates a set of operations for the pen to use when interacting with the touch screen.

Figure 17:
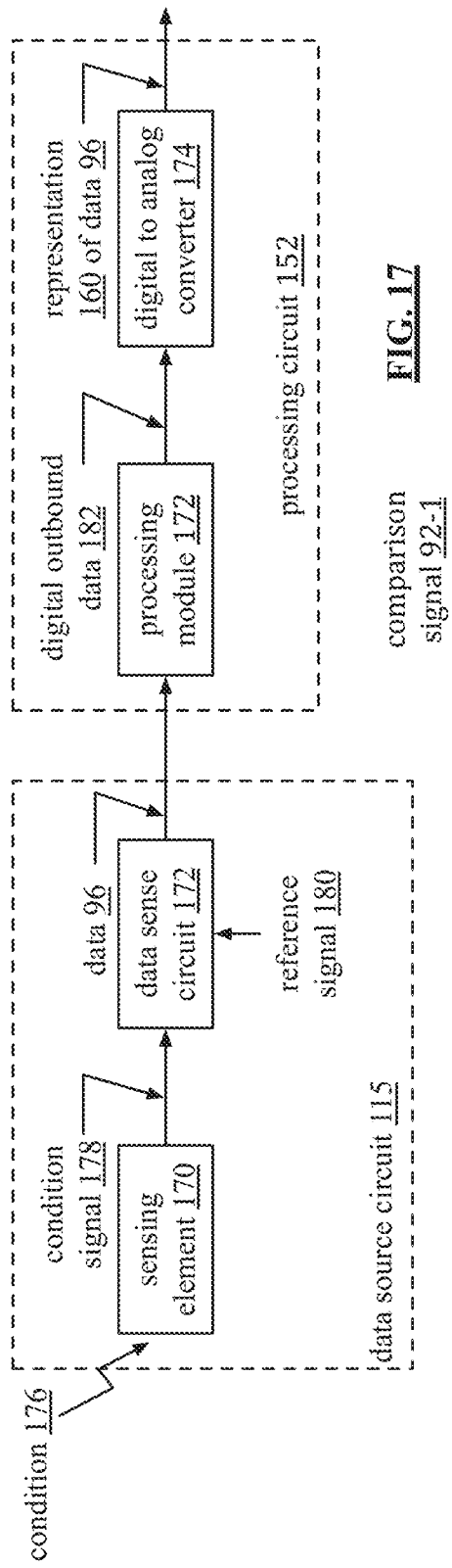
FIG. 17 is a schematic block diagram of an embodiment of a data source circuit and a processing circuit of a pen in accordance with the present invention.

FIG. 17 is a schematic block diagram of an embodiment of a data source circuit 115 and a processing circuit 152 of a pen 16 and/or 16-1. The data source circuit 115 includes a sensing element 170 (e.g., a transducer, switch, circuit, combination, etc.) and a data sense circuit 172. The processing circuit 152 includes a processing module 172 and a digital to analog converter 174.

In an example of operation, the sensing element sense a condition 176 of the pen. For example, the sensing element 170 senses pressure, tilt, color selection, erasure mode selection, other environmental condition, and/or other operational condition of the pen. The sensing element 170 generates a condition signal 178 based on the sensed condition 176 of the pen. The data sense circuit 172 generates the data 96 based on the condition signal 178 and a reference signal 180. The data sense circuit 172 will be described in greater detail with reference to FIG. 18.

The processing module 172 generates digital outbound data 182 based on the data 96. For example, the processing module 172 adjust formatting of the data 96 (e.g., non-return to zero, return to zero, Manchester, etc.), adjust data rate of the data 96, level shifting of the data, etc. The digital to analog converter 174 converts the digital outbound data 182 into the representation 160 of the data 96.

Figure 18:
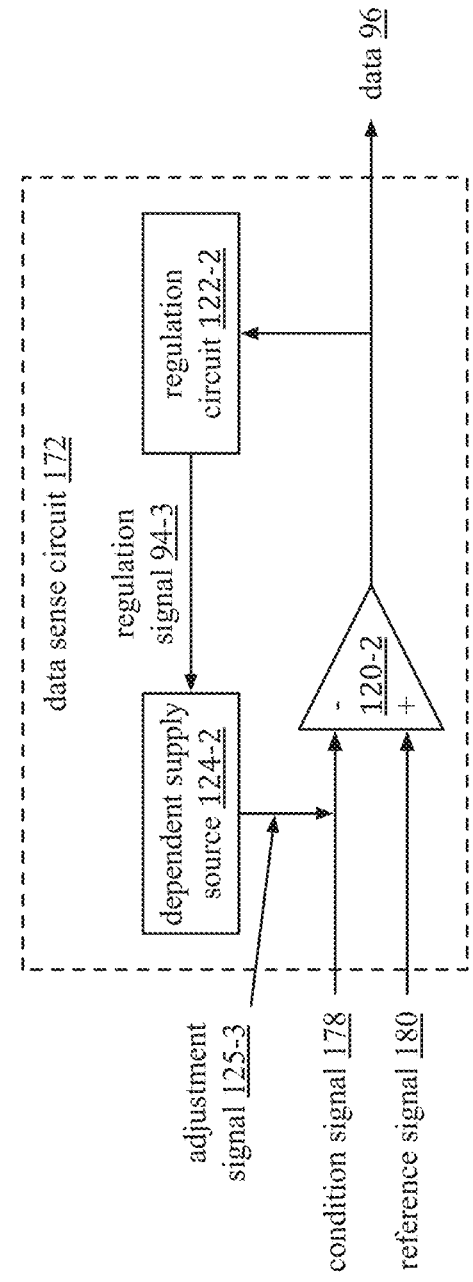
FIG. 18 is a schematic block diagram of an embodiment of a data sense circuit of a pen in accordance with the present invention.

FIG. 18 is a schematic block diagram of an embodiment of a data sense circuit 172 that includes an operational amplifier configuration 120-2 (which may be implemented as shown in FIG. 6A or in a different manner), a regulation circuit 122-2, and a dependent supply source 124-2. In an example of operation, the operational amplifier 120-2 receives the condition signal 178 at its negative input and a reference signal 180 at its positive input to generate the data 96.

The regulation circuit 122-2 generates a regulation signal 94-3 from the data 96. The dependent supply source 124 (e.g., a dependent current source, a dependent voltage supply, a bidirectional dependent current source, a bidirectional dependent voltage supply, etc.) generates an adjustment signal 125-3 such that the voltages inputted in to the operational amplifier 120-2 remain substantially equal, which provides the regulating of receiving the sense signal.

As a specific example, the condition signal 178 is a non-sinusoidal signal having a frequency in the range of tens of Kilo-Hertz to tens of Giga-Hertz and the reference signal 180 is a DC signal (e.g., a DC voltage reference or a DC current reference). The output of the operational amplifier 120-2 (i.e., the data 96) will correspond to the inversion of the condition signal 178. The regulation circuit 122-2 (which may be a capacitor, resistor, wire, combination of capacitors and/or resistors, an integrator, etc.) and the dependent supply source 124-2 provide the gain for the feedback loop of the data sense circuit 172 to generate the regulation signal 94-3 so that the data 96 does not get clipped (e.g., its magnitude is limited by the power supply voltage).

Figure 19A:
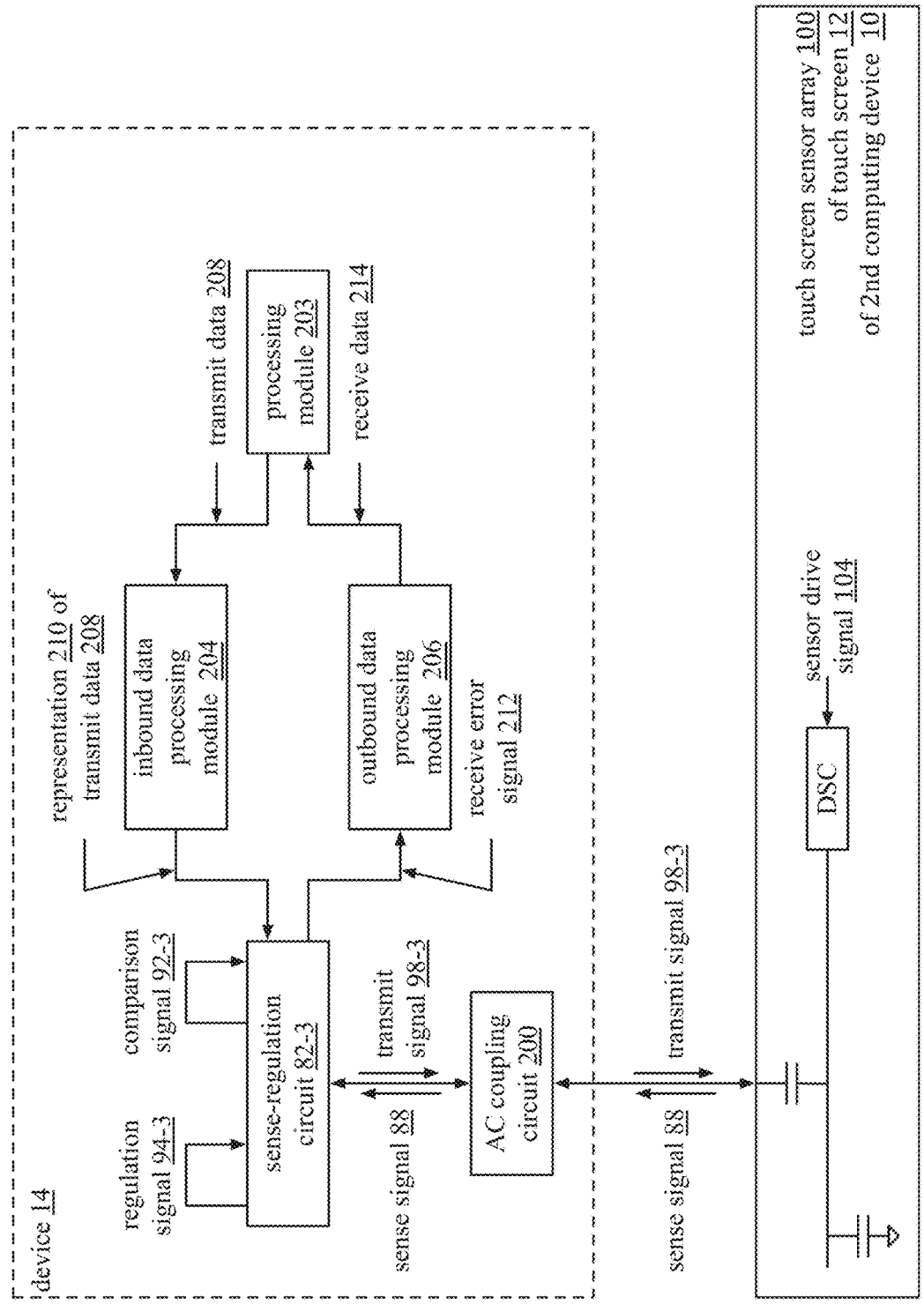
FIG. 19A is a schematic block diagram of an embodiment of a device in accordance with the present invention.

FIG. 19A is a schematic block diagram of an embodiment of a device 14 that includes a sense-regulation circuit 82-3, an AC coupling circuit 200, an inbound data processing module 204, an outbound data processing module 206, and a processing module 203. The AC coupling circuit 200 provides a communication path for the device 14 with the touch screen sensor array 100 of the touch screen 12 of the computing device 10. Note that the inbound data processing module 204, the outbound data processing module 206, and the processing module 203 may be implemented in the same processing circuit, in different processing circuits, or a combination thereof.

For data communication from the computing device 10 to the device 14, the device receives a sense signal 88 via the AC coupling circuit 200. The sense-regulation circuit 82-3 processes the sense signal 88 in light of a representation 210 of transmit data 208 (e.g., data from the processing module 203) to produce a receive error signal 212. As will be described in greater detail with reference to FIGS. 20 and 21, the receive error signal includes a combination of the comparison signal 92-3 and the representation 210 of the transmit data 210.

The outbound data processing module 206 processes the receive error signal 212 and produces, therefrom, receive data 214. For example, the outbound data processing module 214 includes a filtering circuit and digital conversion circuit. The filtering circuit bandpass filters the receive error signal 212 to substantially pass, unattenuated, the comparison signal 92-3 (which is a representation of the sense signal 88) and to attenuate other components of the receive error signal, including the representation 210 of the transmit data. For further examples of an outbound data processing module 214 refer to co-pending patent application entitled, "ANALOG TO DIGITAL CONVERSION CIRCUIT WITH VERY NARROW BANDPASS DIGITAL FILTERING", having a serial number of Ser. No. 16/365,169, and a filing date of Mar. 26, 2019.

The processing module 203 processes the receive data 214 to determine a command, a data request, or other type of digital communication from the computing device 10. In addition, the processing module 203 generates transmit data 208 for sending to the computing device 10.

The inbound data processing module 204 converts the transmit data 208 into the representation 210 of the transmit data 208. The inbound data processing module 204 may be implemented as a signal generator, which is described in co-pending patent application entitled, "RECEIVE ANALOG TO DIGITAL CIRCUIT OF A LOW VOLTAGE DRIVE CIRCUIT DATA COMMUNICATION SYSTEM", having a serial number of Ser. No. 16/266,953, and a filing date of Feb. 4, 2019.

The sense-regulation circuit processes the representation 210 of the transmit data 208 to produce a transmit signal 98-3. The AC coupling circuit 200 sends the transmit signal 98-3 to the touch screen sensor array 100.

Figure 19B:
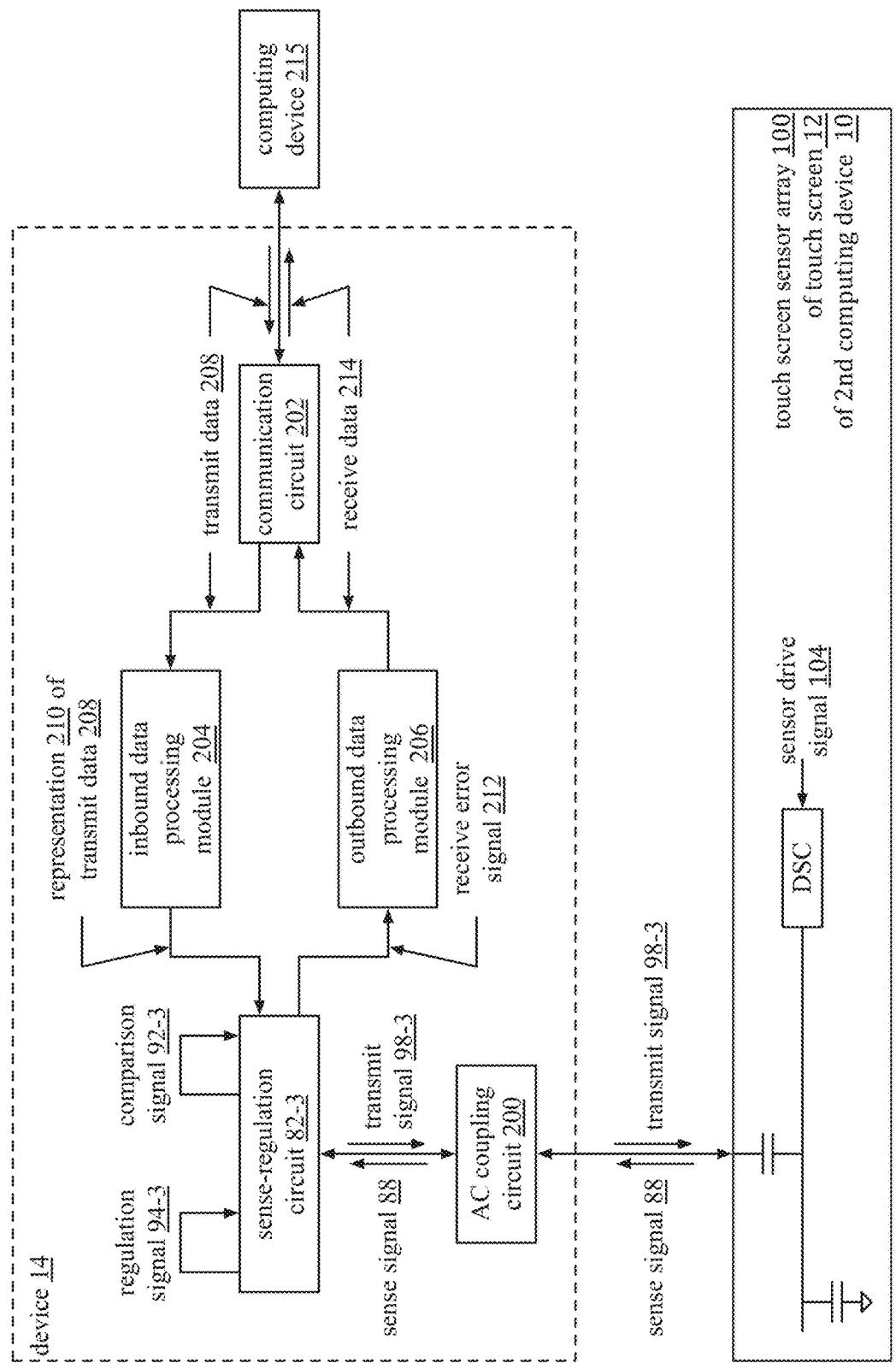
FIG. 19B is a schematic block diagram of another embodiment of a device in accordance with the present invention.

FIG. 19B is a schematic block diagram of an embodiment of a device 14 that includes a sense-regulation circuit 82-3, an AC coupling circuit 200, an inbound data processing module 204, an outbound data processing module 206, and a communication circuit 202. The AC coupling circuit 200 provides a communication path for the device 14 with the touch screen sensor array 100 of the touch screen 12 of the computing device 10. The communication circuit 202 provides a communication path with another computing device 215. In an embodiment, the device 14 functions as a full duplex communication medium between the touch screen of the computing device 10 and a communication port of the other computing device 215.

For data communication from the computing device 10 to the other computing device 215, the device receives a sense signal 88 via the AC coupling circuit 200. The sense-regulation circuit 82-3 processes the sense signal 88 in light of a representation 210 of transmit data 208 (e.g., data from the other computing device 215 to the computing device 10)

to produce a receive error signal 212. As will described in greater detail with reference to FIGS. 20 and 21, the receive error signal includes a combination of the comparison signal 92-3 and the representation 210 of the transmit data 210.

The outbound data processing module 206 processes the receive error signal 212 and produces, therefrom, receive data 214. For example, the outbound data processing module 214 includes a filtering circuit and digital conversion circuit. The filtering circuit bandpass filters the receive error signal 212 to substantially pass, unattenuated, the comparison signal 92-3 (which is a representation of the sense signal 88) and to attenuate other components of the receive error signal, including the representation 210 of the transmit data. For further examples of an outbound data processing module 214 refer to co-pending patent application entitled, "ANALOG TO DIGITAL CONVERSION CIRCUIT WITH VERY NARROW BANDPASS DIGITAL FILTERING," having a serial number of Ser. No. 16/365,169, and a filing date of Mar. 26, 2019.

The communication circuit 202, which may be a USB (Universal Serial Bus) interface, a Lighting interface, a serial interface such as I3C/I2C, NFC (Near Field Communication), Bluetooth, Wi-Fi, etc., sends the receive data 214 to the other computing device 215. In addition, the communication circuit 202 receives transmit data 208 from the other computing device 215 and provides it to the inbound data processing module 204.

The inbound data processing module 204 converts the transmit data 208 into the representation 210 of the transmit data 208. The inbound data processing module 204 may be implemented as a signal generator, which is described in co-pending patent application entitled, "RECEIVE ANALOG TO DIGITAL CIRCUIT OF A LOW VOLTAGE DRIVE CIRCUIT DATA COMMUNICATION SYSTEM," having a serial number of Ser. No. 16/266,953, and a filing date of Feb. 4, 2019.

The transmit data 208 includes data regarding the other computing device and/or regarding the device, such as:
  identification of the computing device (e.g., serial number, IP address, cell phone number, user information, etc.);
  identification of a type of computing device (e.g., cell phone, mouse, keyboard, ruler, laptop, etc.);
  location information regarding the computing device with respect to the touch screen;
  time synchronization information;
  application activation information; and
  request for touch screen to provide graphical user interface for the computing device.

The sense-regulation circuit processes the representation 210 of the transmit data 208 to produce a transmit signal 98-3. The AC coupling circuit 200 sends the transmit signal 98-3 to the touch screen sensor array 100.

Figure 20:
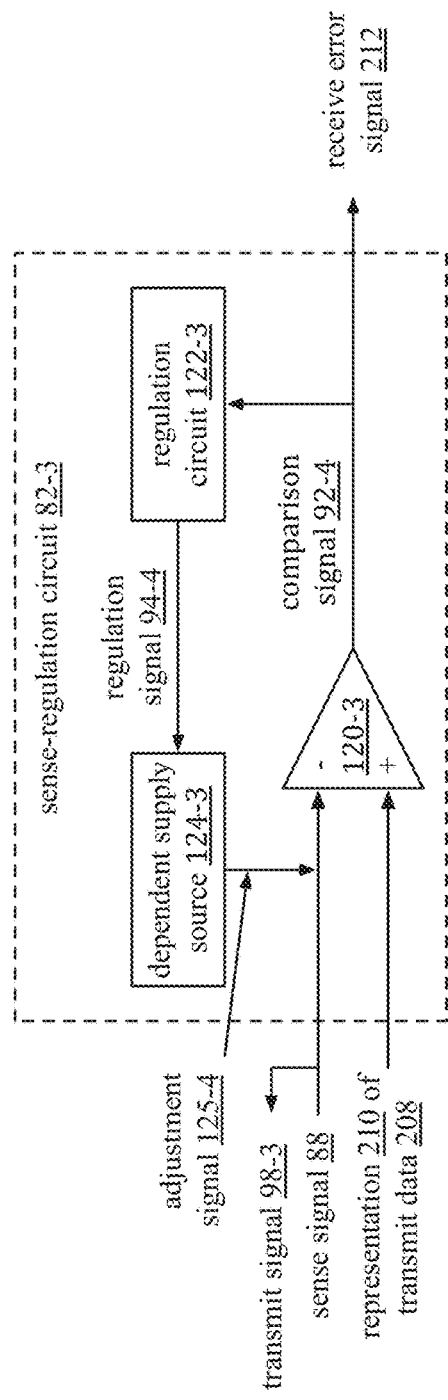
FIG. 20 is a schematic block diagram of an embodiment of a sense-regulation circuit of a device in accordance with the present invention.

FIG. 20 is a schematic block diagram of an embodiment of a sense-regulation circuit 82-3 of a device 14. The sense-regulation circuit 82-3 includes an operational amplifier 120-3, a regulation circuit 122-3, and the dependent current source 124-3.

In an example of operation, the operational amplifier 120-3 receives the sense signal 88 at its negative input and the representation 210 of the transmit data 208 at its positive input to generate the comparison signal 92-4. The regulation circuit 122-3 generates a regulation signal 94-4 from the comparison signal 92-4. The dependent supply source 124-3 generates an adjustment signal 125-4 such that the voltages inputted into the operational amplifier 120-3 remain substantially equal, which provides the regulating of receiving the sense signal 88 and regulation of transmitting the transmit signal 98-3.

As a specific example, the sense signal 88 is a sinusoidal signal having a frequency in the range of tens of Kilo-Hertz to tens of Giga-Hertz and the representation 210 of the transmit data 208 is a second sinusoidal signal having a different frequency than that of the sense signal. The output of the operational amplifier 120-3 (i.e., the comparison signal 92-4) correspond to a difference between the sense signal 88 and the representation 210 of the transmit data 208. The regulation circuit 122-3 and the dependent supply source 124-3 provide the gain for the feedback loop of the sense-regulation circuit 82-3 to generate the regulation signal 94-4 so that the comparison signal 92-4 does not get clipped. As such, the comparison signal 92-4 includes a representation (e.g., includes the same information but may be of a different magnitude, phase, or domain) of the sense signal 88 and of the representation 210 of the transmit data 208.

Figure 21:
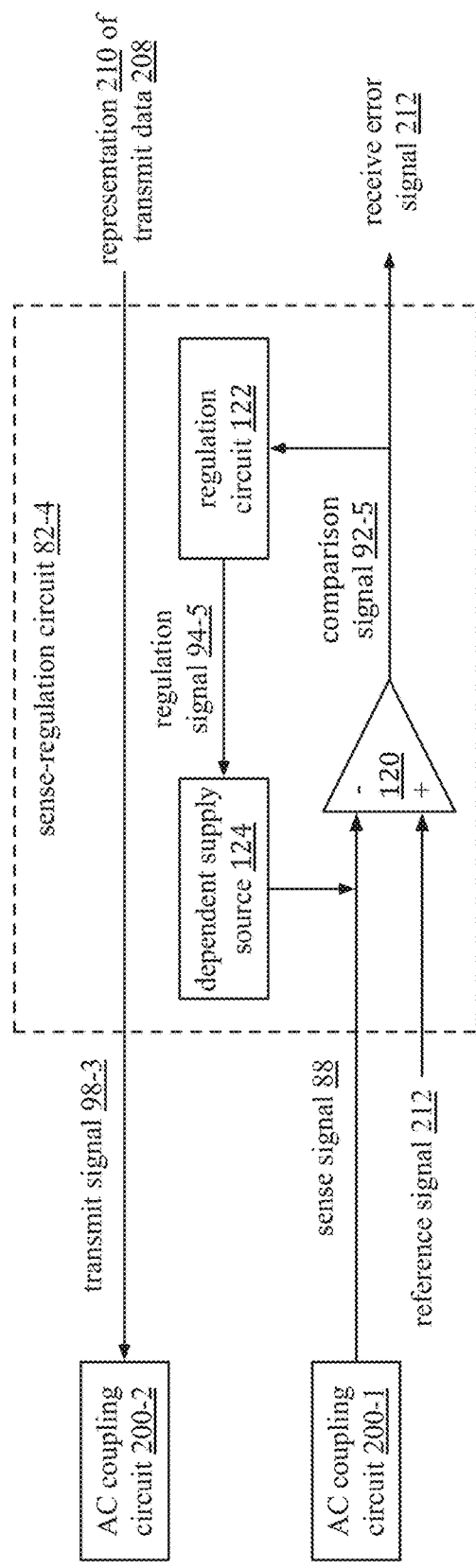
FIG. 21 is a schematic block diagram of another embodiment of a sense-regulation circuit of a device in accordance with the present invention.

FIG. 21 is a schematic block diagram of another embodiment of a sense-regulation circuit 82-4 of a device 14. The sense-regulation circuit 82-4 includes the operational amplifier configuration 120 (which may be implemented as shown in FIG. 6A or in a different manner), the regulation circuit 122, the dependent supply source 124, and a by-pass line, which couples the representation 210 of the transmit data 208 to a second AC coupling circuit 200-2. The operational amplifier 120, the regulation circuit 122, and the dependent supply source 124 function as previously described to generate the comparison signal 92-5 from the sense circuit 88 and a reference signal 212. In this embodiment, the receive error signal 212 corresponds to the comparison signal 92-5.

Figure 22:
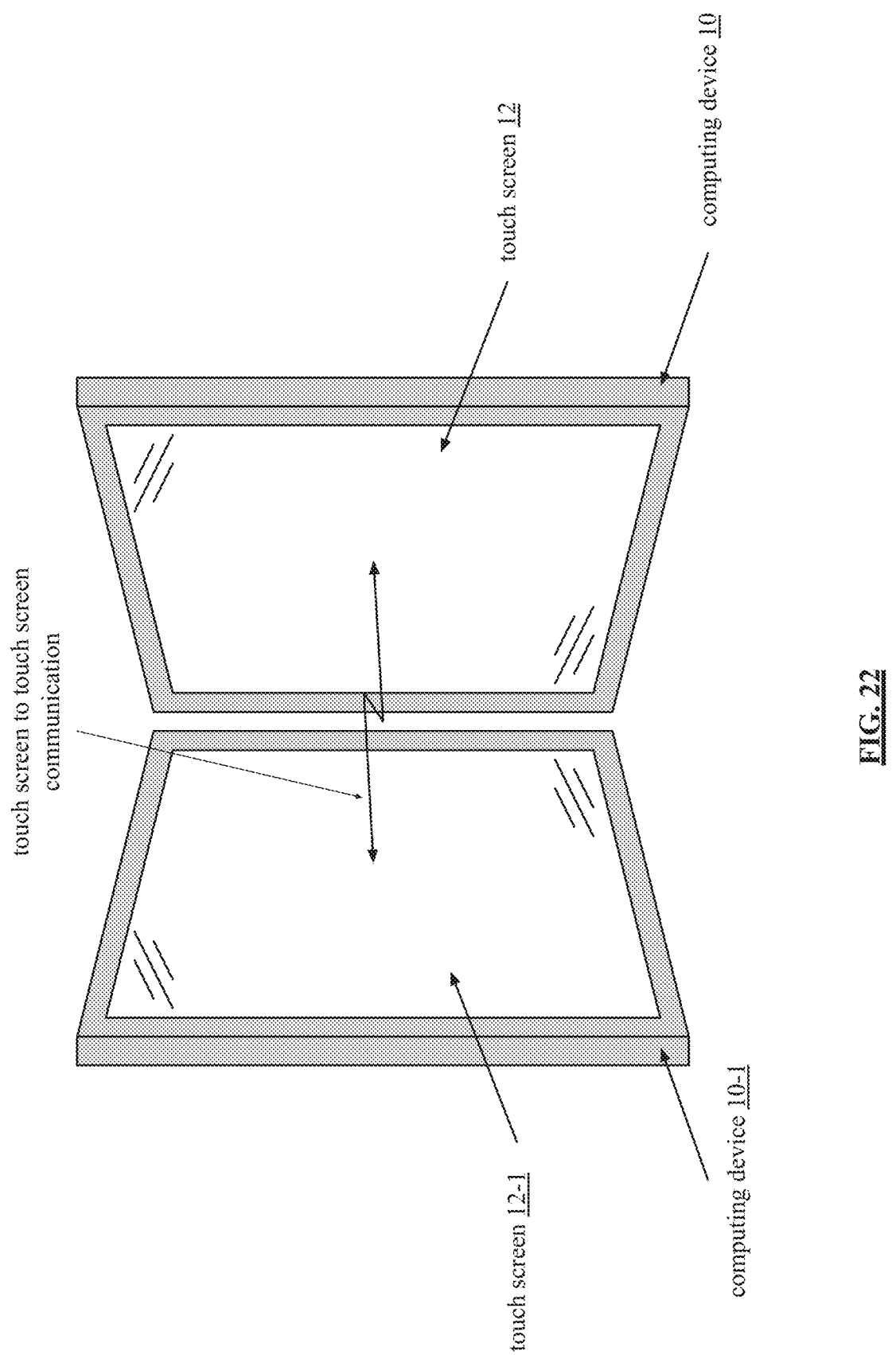
FIG. 22 is a schematic block diagram of an embodiment of a touch screen to touch screen communication between two computing devices in accordance with the present invention.

FIG. 22 is a schematic block diagram of an embodiment of a touch screen to touch screen communication between two computing devices 10 and 10-1. Both computing devices include a touch screen 12. When the computing devices are face to face, the computing devices are able to communicate via their respective touch screens.

To accomplish this, each computing device includes the circuitry of device 14. The circuitry of device 14 may be integrated into the touch screen control circuit or it may be a stand-alone circuit. When the computing devices are face to face, they can utilize a plurality of patterns (frequency and/or electrode enable) to communication data there between. One or more patterns may be used to set up the communication and the patterns to be used for conveying data.

Figure 23A:
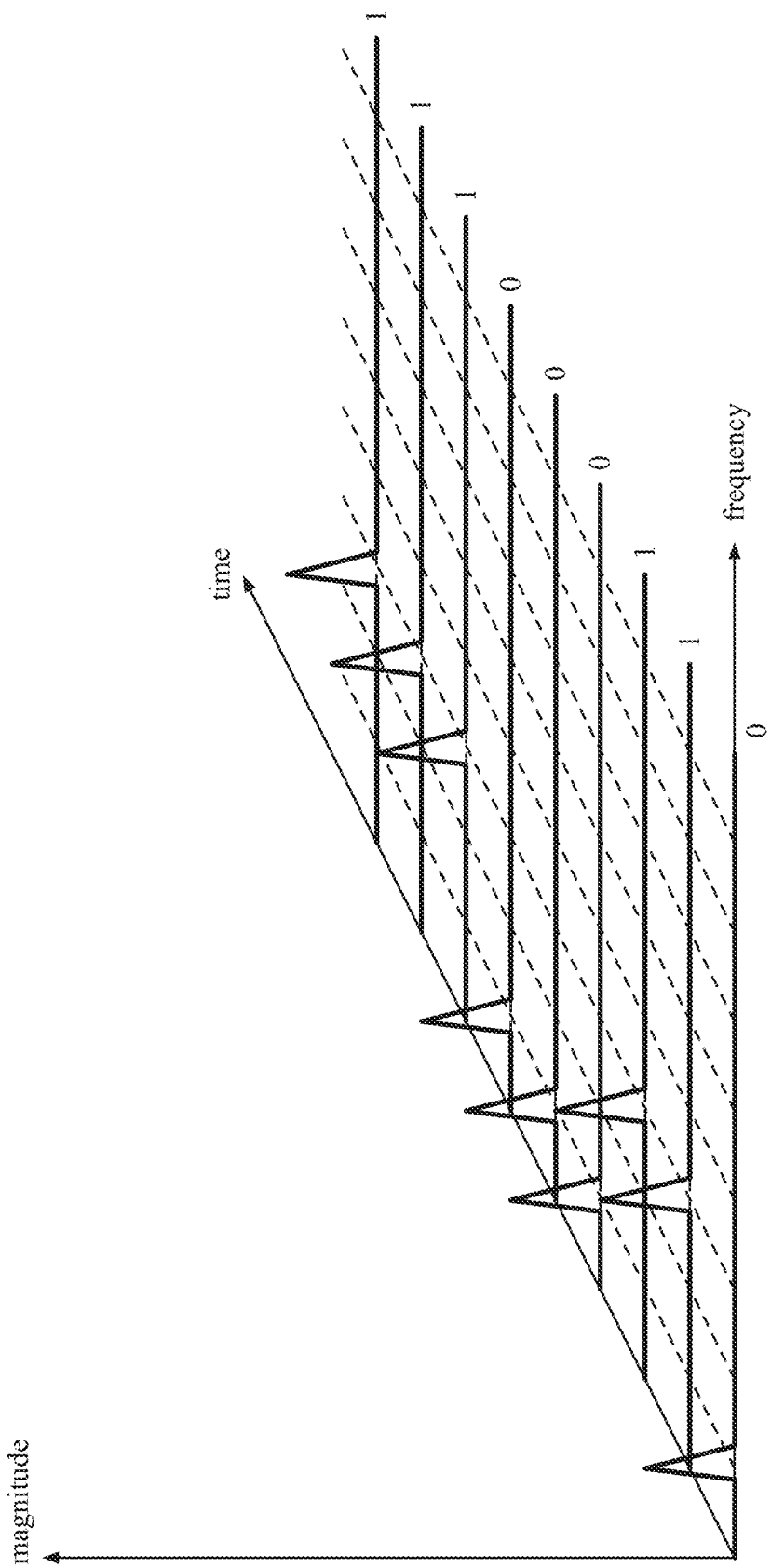
FIG. 23A is a schematic block diagram of an example of a frequency pattern representing data in accordance with the present invention.

FIG. 23A is a schematic block diagram of an example of a frequency pattern representing data that is embedded in the sense signal and/or data that is embedded in the transmit data. In this example, a frequency pattern is established over time to represent data. As shown, a first frequency corresponds to a logic value of 0 and a second frequency corresponds to a logic value of 1. The pattern can be interpreted by the inbound and/or outbound processing modules to convert the pattern into data and/or data into the pattern.

Figure 23D:
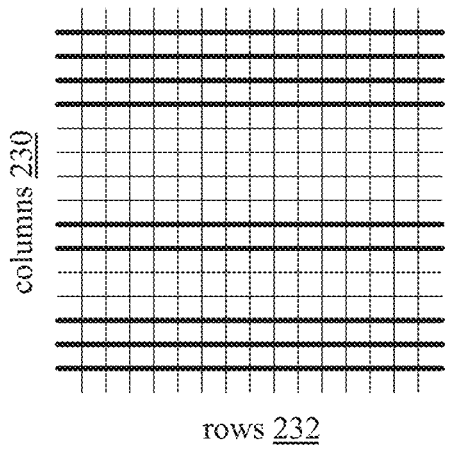
FIGS. 23B-23F are schematic block diagrams of examples of electrode patterns representing data in accordance with the present invention.
Figure 23C:
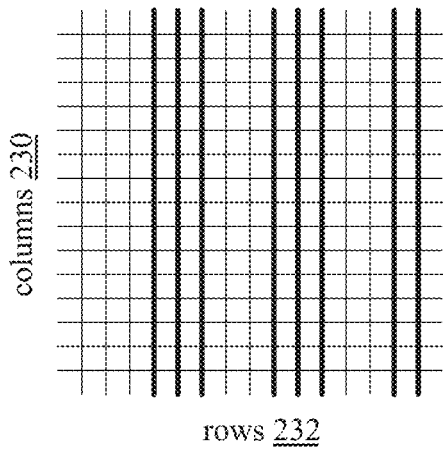
Figure 23B:
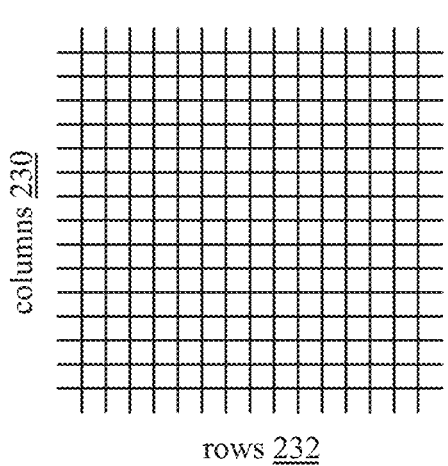

FIGS. 23B-23F are schematic block diagrams of examples of electrode patterns representing data. FIG. 23B illustrates row electrodes 232 and column electrodes 230 being in an orthogonal relationship. In the examples of FIG. 23C through 23F, thicker lines for the electrodes indicate that the electrode is enabled (e.g., a DSC is driving a sensing signal on the electrode) and thinner lines for the electrodes indicate that the electrode is not enabled (e.g., a DSC is not driving a sensing signal on the electrode).

FIG. 23C illustrates a row pattern where all column electrodes are not enabled and some of the row electrodes are enabled. The patterning of which row electrodes to enable and disable for a data message may be done in a bar code style. A pattern may be used to represent one bit of data, one byte of data, a specific message, or a specific command. As is readily apparent, a large number of patterns can be obtained by selectively enabling and disabling row electrodes.

Figure 23F:
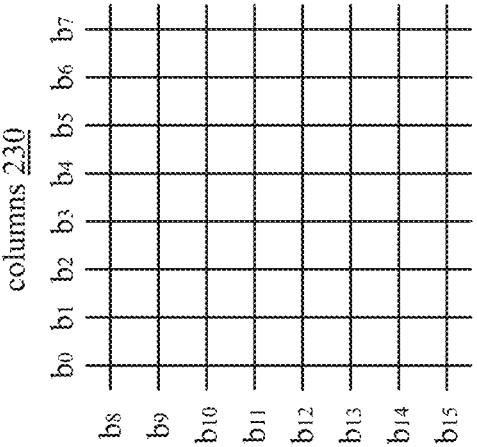
Figure 23E:
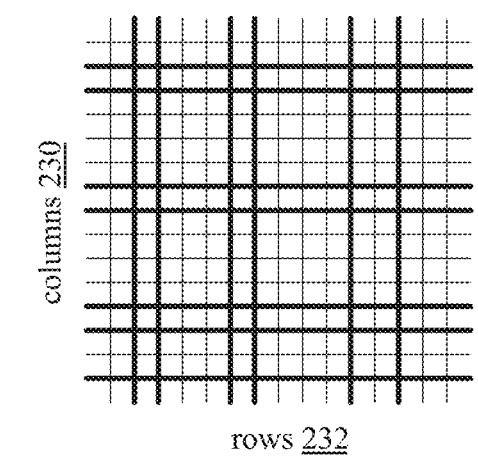

FIG. 23D illustrates a column pattern where all row electrodes are not enabled and some of the column electrodes are enabled to represent different data. FIG. 23E illustrates a row and a column pattern where some of the row electrodes are enabled and some of the column electrodes are enabled. FIG. 23F illustrates each row and column electrode representing a bit of data. In this example, there are 8 row electrodes and 8 column electrodes representing 16 bits of data. For the examples of FIG. 23C through 23F, the row and column electrodes included in a pattern area may encompass the entire touch screen area or a portion thereof.

Figure 24:
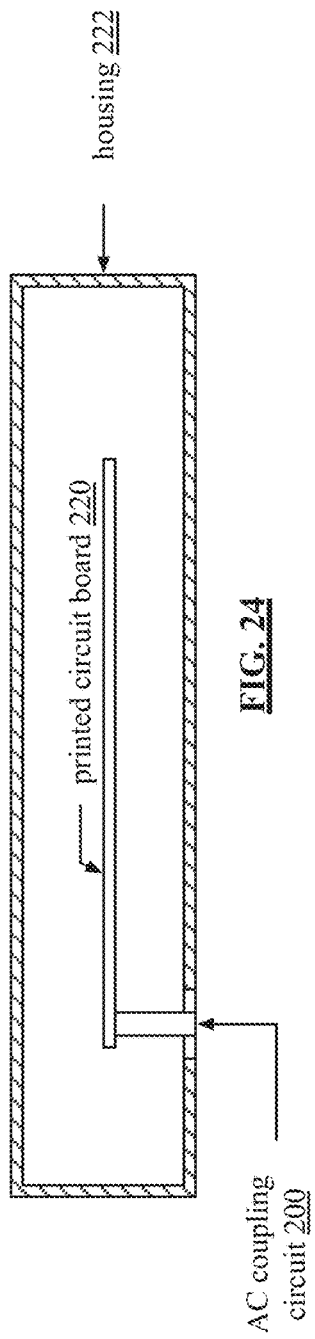
FIG. 24 is a schematic block diagram of an example of a device including a housing and AC coupling circuit in accordance with the present invention.

FIG. 24 is a schematic block diagram of an example of a device including a housing 222 and AC coupling circuit 200 of the device 14. In this embodiment, the circuitry of the device is on the printed circuit board 220, which is mounted in the housing 222. The housing 222 may be implemented in a variety of ways. For example, the housing 222 is a case for a phone. As another example, the housing is in the form of a computing mouse. As yet another example, the housing is in the form of a keyboard.

The AC coupling circuit 200 is electrically coupled to the printed circuit board 220 and includes a conductive pad that is electrically isolated from the housing 22. The conductive pad may be implemented in a variety of ways. For example, the conductive pad is a pin. As another example, the conductive pad is an electrode and/or metal trace. As yet another example, the conductive pad is a conductive material having a shape to receive the sense signal from the touch screen and/or to transmit the transmit signal to the touch screen.

Figure 25:
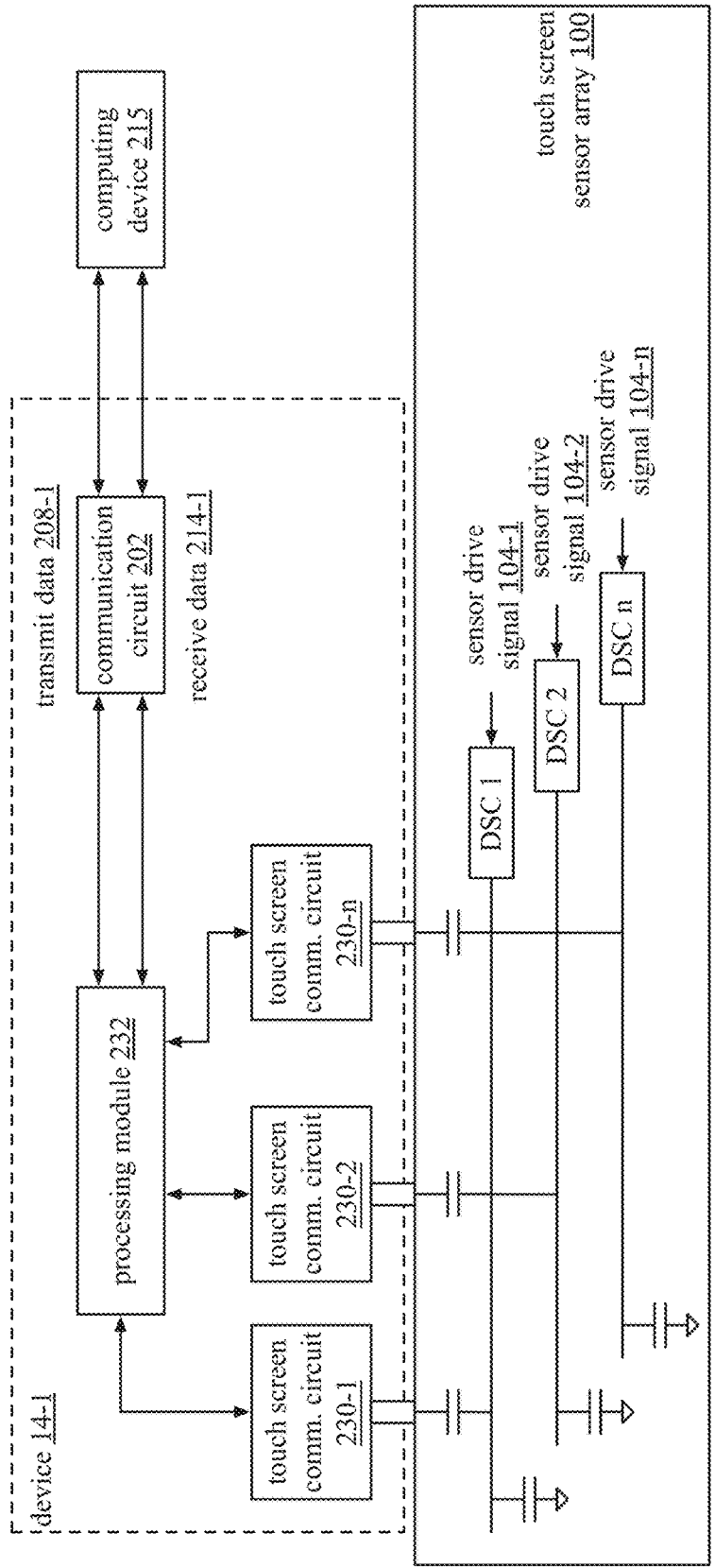
FIG. 25 is a schematic block diagram of an embodiment of a device in accordance with the present invention.

FIG. 25 is a schematic block diagram of an embodiment of a device 14-1 that includes touch screen communication circuits 230-1 through 230-n, a processing module 232, and a communication circuit 202. Each of the touch screen communication circuits includes at least one AC coupling circuit that provides electrical connectivity to different drive sense circuits (DSC 1-n) of the touch screen sensor array 100 of the touch screen 12 of the computing device 10. The communication circuit 202 provides a communication path with another computing device 215. In an embodiment, the device 14-1 functions as a full duplex communication medium between the touch screen of the computing device 10 and a communication port of the other computing device 215.

The touch screen communication circuits 230-1 through 230-n may be implemented in accordance with the circuitry of a pen and/or the circuitry of a device as previously discussed. With multiple touch screen communication circuits, multiple pieces of information can be conveyed between the computing devices 10 and 215. For example, the location and orientation of the device on the touch screen can be determined based on the information conveyed to the touch screen and which DSCs received the transmit signals. As another example, the multiple pieces of information can be used to determine motion of the device on the touch screen to indicate a gesture-based function or other function.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A pen for interacting with a touch screen, the pen comprises:
    an alternating current (AC) coupling circuit comprising:
        a first AC coupling circuit operable to receive a sense signal from the touch screen, wherein the first AC coupling circuit is physically located at a first location of the pen; and
        a second AC coupling circuit operable to transmit a transmit signal to the touch screen, wherein the second AC coupling circuit is physically located at a second location of the pen, wherein the touch screen is capable of discerning between the first and second locations, and wherein the touch screen is capable of interpreting the transmit signal as an input to the touch screen; and
    a sense-regulation circuit operable to:
        receive the sense signal from the AC coupling circuit;
        receive a representation of transmit data; and
        convert the representation of the transmit data into the transmit signal.

2. The pen of claim 1 further comprises:
    a processing circuit operable to:
        receive data; and
        generate the representation of the transmit data based on the data.

3. The pen of claim 2 further comprises:
    a data source circuit that comprises:
        a sensing element operable to:
            sense a condition of the pen; and
            generate a condition signal based on the sensing the condition; and
        a data sense circuit operable to generate the data based on the condition signal and a reference signal.

4. The pen of claim 3, wherein the condition comprises one or more of:
    a pressure;
    a tilt;
    a color selection;
    a mode selection;
    another operational condition of the pen; and
    an environmental condition.

5. The pen of claim 3, wherein the data sense circuit comprises:
    an operational amplifier operable to:
        receive the condition signal on a first input;
        receive the reference signal on a second input; and
        generate the data based on the condition signal and the reference signal;
    a regulation circuit operable to generate a regulation signal based on the data; and
    a dependent supply source operable to generate an adjustment signal such that voltages on the first and second inputs remain substantially equal.

6. The pen of claim 2, wherein the processing circuit comprises:
    a processing module operable to generate digital outbound data based on the data; and
    a digital to analog converter operable to generate the representation of the transmit data based on the digital outbound data.

7. The pen of claim 1, wherein the sense-regulation circuit comprises:
    an operational amplifier having:
        a negative input coupled to receive the sense signal;
        a positive input coupled to receive the representation of the transmit data; and
        an output coupled to provide a comparison signal based on the sense signal and the representation of the transmit data;
    a regulation circuit operably coupled to generate a regulation signal based on the comparison signal; and
    a dependent supply source operably coupled to provide an adjustment signal to a node coupling the negative input of the operational amplifier to the AC coupling circuit, wherein the dependent supply source generates the adjustment signal based on the regulation signal.

8. The pen of claim 1, wherein the AC coupling circuit comprises:
    a conductive pen tip; and
    a conductive pen shell and cone.

* * * * *